US012204384B2

United States Patent
Ahn et al.

(10) Patent No.: US 12,204,384 B2
(45) Date of Patent: Jan. 21, 2025

(54) ELECTRONIC DEVICE INCLUDING HEAT DISSIPATION STRUCTURE

(71) Applicant: SAMSUNG ELECTRONICS CO., LTD., Suwon-si (KR)

(72) Inventors: Joseph Ahn, Suwon-si (KR); Kyungha Koo, Suwon-si (KR); Hongki Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 136 days.

(21) Appl. No.: 17/869,109

(22) Filed: Jul. 20, 2022

(65) Prior Publication Data

US 2023/0026298 A1    Jan. 26, 2023

Related U.S. Application Data

(63) Continuation of application No. PCT/KR2022/008133, filed on Jun. 9, 2022.

(30) Foreign Application Priority Data

Jul. 20, 2021    (KR) .......................... 10-2021-0095095

(51) Int. Cl.
*G06F 1/16*    (2006.01)
*G06F 1/20*    (2006.01)
(Continued)

(52) U.S. Cl.
CPC ............ *G06F 1/203* (2013.01); *G06F 1/1616* (2013.01); *G06F 1/1626* (2013.01);
(Continued)

(58) Field of Classification Search
CPC ...... G06F 1/1616; G06F 1/1626; G06F 1/203; H04M 1/0216; H04M 1/026; H04M 1/02;
(Continued)

(56) References Cited

U.S. PATENT DOCUMENTS 9,103,021 B2 *    8/2015 Zadesky ............ H05K 7/20509
10,019,046 B2 *    7/2018 Shen ...................... G06F 1/1643
(Continued)

FOREIGN PATENT DOCUMENTS

CN    104780739 A    *    7/2015
CN    110271244    9/2019
(Continued)

OTHER PUBLICATIONS

Search Report and Written Opinion dated Sep. 13, 2022 issued in International Patent Application No. PCT/KR2022/008133.
(Continued)

*Primary Examiner* — Zachary Pape
(74) *Attorney, Agent, or Firm* — NIXON & VANDERHYE P.C.

(57) ABSTRACT

According to various embodiments of the disclosure, an electronic device may include: a housing, a display accommodated inside the housing, a support supporting the display and including a opening and a side wall surrounding the opening, and a heat dissipation structure at least a portion of which is positioned in the opening and bonded to the side wall, wherein the heat dissipation structure may include a heat dissipation layer having a first thermal conductivity and a protective layer having a second thermal conductivity, is the second thermal conductivity being lower than the first thermal conductivity, the protective layer covering at least a portion of the heat dissipation layer.

18 Claims, 20 Drawing Sheets

(51) Int. Cl.
    *H04M 1/02*     (2006.01)
    *H05K 5/00*     (2006.01)
    *H05K 5/02*     (2006.01)
    *H05K 5/04*     (2006.01)
    *H05K 7/20*     (2006.01)

(52) U.S. Cl.
    CPC ......... *H04M 1/0216* (2013.01); *H04M 1/026* (2013.01); *H05K 5/0226* (2013.01); *H05K 5/04* (2013.01); *H05K 7/20481* (2013.01); *H05K 7/20963* (2013.01); *H04M 1/02* (2013.01); *H04M 1/0268* (2013.01); *H05K 5/0018* (2022.08)

(58) Field of Classification Search
    CPC ..... H04M 1/0268; H05K 5/0226; H05K 5/04; H05K 5/0018; H05K 7/20481; H05K 7/20509

See application file for complete search history.

(56) References Cited

U.S. PATENT DOCUMENTS

| | | | |
|---|---|---|---|
| 10,856,443 | B2* | 12/2020 | Counts ................... H05K 7/205 |
| 2009/0207569 | A1 | 8/2009 | Tsunoda et al. |
| 2013/0250504 | A1 | 9/2013 | Choi |
| 2014/0369000 | A1 | 12/2014 | Kim et al. |
| 2016/0018862 | A1 | 1/2016 | Chuang et al. |
| 2018/0084680 | A1 | 3/2018 | Jarvis et al. |
| 2019/0082555 | A1 | 3/2019 | Hooton et al. |
| 2019/0212792 | A1 | 7/2019 | Bailey et al. |
| 2019/0245955 | A1* | 8/2019 | Lee ..................... H04M 1/0268 |
| 2020/0204666 | A1* | 6/2020 | Hong ..................... G06F 1/206 |
| 2020/0229312 | A1 | 7/2020 | Ha |
| 2020/0356143 | A1 | 11/2020 | Oh et al. |
| 2021/0037683 | A1 | 2/2021 | Ma et al. |
| 2021/0101364 | A1* | 4/2021 | Hashimoto ............... C22F 1/00 |
| 2023/0301043 | A1* | 9/2023 | Ko ....................... G06F 1/1652 |
| | | | 361/704 |

FOREIGN PATENT DOCUMENTS

| | | |
|---|---|---|
| JP | 3092598 | 3/2003 |
| JP | 2003-293059 | 10/2003 |
| JP | 5932297 | 6/2016 |
| JP | 2019-155740 | 9/2019 |
| JP | 2021-516863 | 7/2021 |
| KR | 10-1083912 | 11/2011 |
| KR | 10-1184627 | 9/2012 |
| KR | 10-1861278 | 5/2018 |
| KR | 10-1962470 | 12/2018 |
| KR | 10-2020-0089376 | 7/2020 |

OTHER PUBLICATIONS

Extended European Search Report for EP Application No. 22846040.8 dated Oct. 9, 2024, 9 pages.

* cited by examiner

ELECTRONIC DEVICE INCLUDING HEAT DISSIPATION STRUCTURE

CROSS-REFERENCE TO RELATED APPLICATIONS

This application is a continuation of International Application No. PCT/KR2022/008133 designating the United States, filed on Jun. 9, 2022, in the Korean Intellectual Property Receiving Office and claiming priority to Korean Patent Application No. 10-2021-0095095, filed on Jul. 20, 2021, in the Korean Intellectual Property Office, the disclosures of which are incorporated by reference herein in their entireties.

BACKGROUND

Field

The disclosure relates to an electronic device including a heat dissipation structure.

Description of Related Art

In line with the remarkable development of information and communication technology and semiconductor technology, the supply and use of various electronic devices are rapidly increasing. In particular, recent electronic devices have been developed to perform communication while being carried.

In addition, electronic devices may output stored information as sound or images. As the degree of integration of electronic devices increases and high-speed and large-capacity wireless communication becomes common, various functions may be provided in one electronic device, such as a mobile communication terminal. For example, entertainment functions such as games, multimedia functions such as music/video playback, communication and security functions for mobile banking and the like, and schedule management and electronic wallet functions, as well as communication functions, are being integrated into one electronic device. Such electronic devices are being miniaturized in order for users to conveniently carry the same.

Electronic devices are being reduced in size and weight in order to maximize portability and user convenience, and integrated components are mounted to a smaller space for high performance. Accordingly, the components used in the electronic device may have a high temperature due to heat generation due to high performance thereof, and the heat generated from the components of the electronic device may affect adjacent components, thereby degrading the overall performance of the electronic device.

A graphite film may be used to dissipate heat generated from the electronic components. However, if the electronic device includes a graphite film, a structure for attaching the graphite film is required, and thus a mounting space inside the electronic device may be reduced.

SUMMARY

Embodiments of the disclosure provide an electronic device capable of dissipating heat generated from electronic components and supporting the components of the electronic device using a heat dissipation structure bonded to a support member.

The problems addressed in the disclosure are not limited to the above-mentioned problems, and may be variously expanded.

According to various example embodiments of the disclosure, an electronic device may include: a housing, a display accommodated inside the housing, a support supporting support the display and including a opening and a side wall surrounding the opening, and a heat dissipation structure at least a portion of which is positioned in the opening and bonded to the side wall, wherein the heat dissipation structure may include a heat dissipation layer having a first thermal conductivity and a protective layer having a second thermal conductivity, is the second thermal conductivity being lower than the first thermal conductivity, the protective layer covering at least a portion of the heat dissipation layer.

According to various example embodiments of the disclosure, an electronic device may include: a housing including a first housing and a second housing, a hinge accommodated in the housing and connected to the first housing and the second housing, a display disposed over the first housing, the hinge, and the second housing, a support including a first side wall positioned inside the first housing and a second side wall positioned inside the second housing, and a heat dissipation structure including a first area bonded to the first side wall, a second area bonded to the second side wall, and a third area positioned between the first area and the second area, and configured to be folded based on the third area, wherein the heat dissipation structure may include a heat dissipation layer having a first thermal conductivity and a protective layer having a second thermal conductivity, is the second thermal conductivity being lower than the first thermal conductivity, and the protective layer covering at least a portion of the heat dissipation layer.

An electronic device according to various example embodiments of the disclosure may include a heat dissipation structure that is bonded to a support and includes a heat dissipation layer and a protective layer. The heat dissipation structure is able to dissipate heat generated from electronic components using a heat dissipation layer and maintain rigidity of the electronic device using a support layer.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
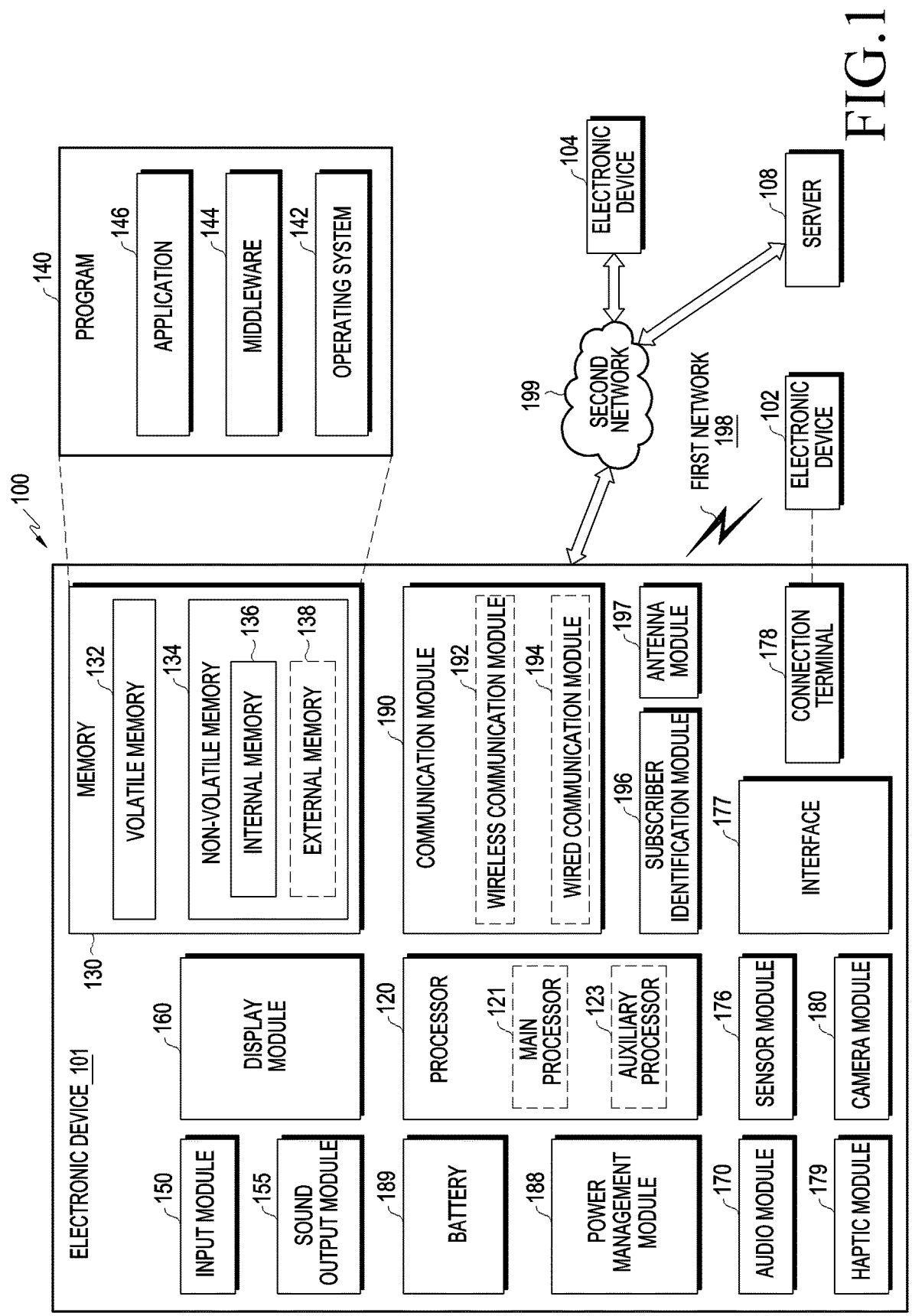
FIG. 1 is a block diagram illustrating an example electronic device in a network environment according to various embodiments.

FIG. 1 is a block diagram illustrating an example electronic device in a network environment according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
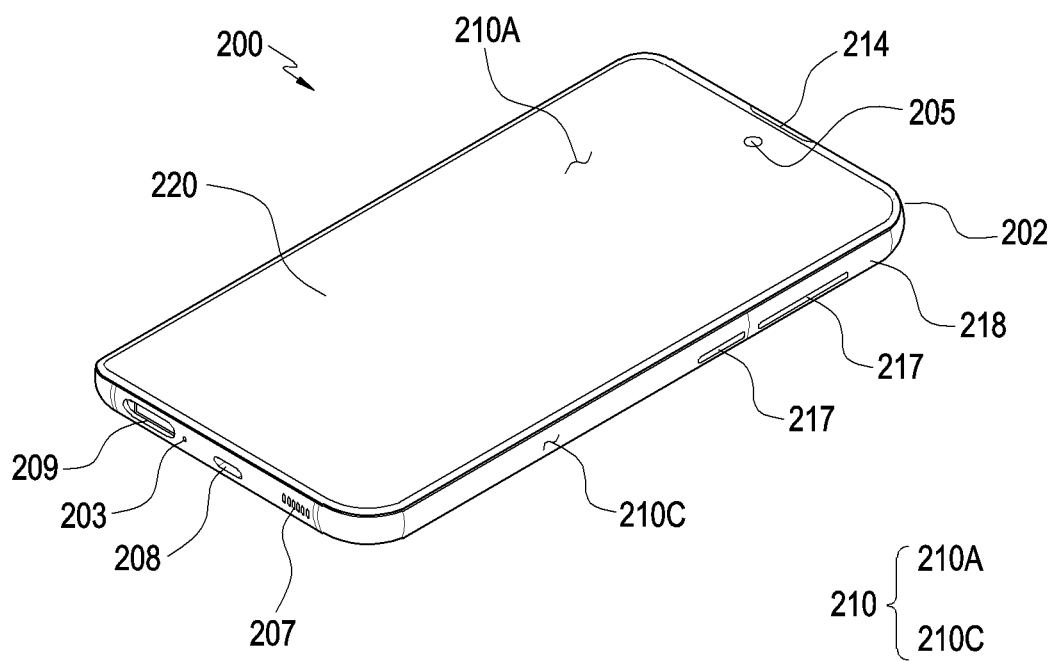
FIG. 2 is a front perspective view of an electronic device according to various embodiments.
Figure 3:
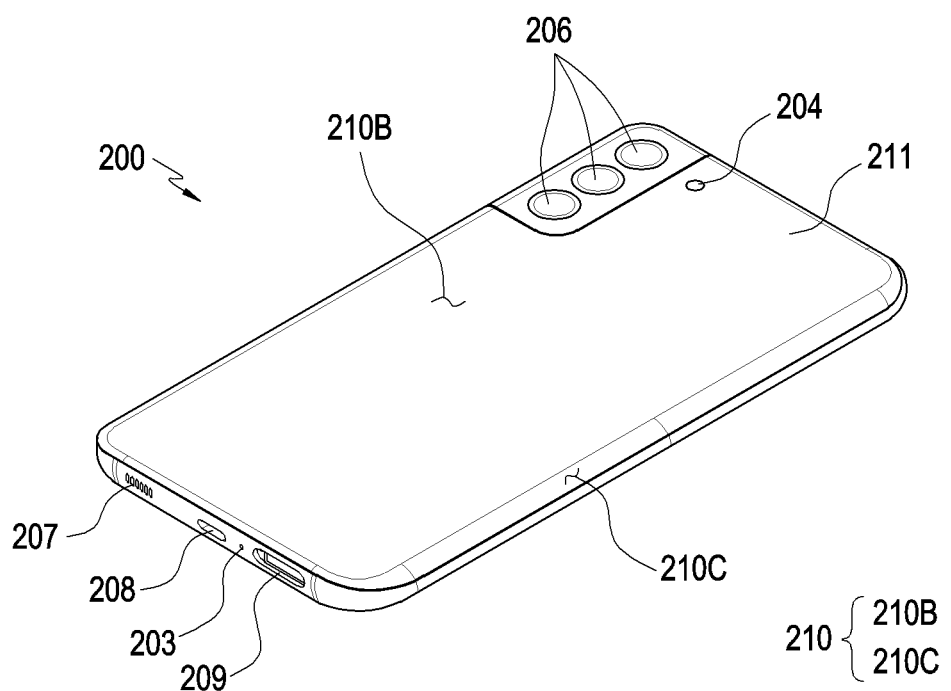
FIG. 3 is a rear perspective view of an electronic device according to various embodiments.

FIG. 2 is a front perspective view of an electronic device according to various embodiments. FIG. 3 is a rear perspective view of an electronic device according to various embodiments.

Referring to FIGS. 2 and 3, an electronic device 200 according to an embodiment may include a housing 210 that includes a front surface 210A, a rear surface 210B, and a side surface 210C surrounding the space between the front surface 210A and the rear surface 210B. In an embodiment (not shown), the housing 210 may refer to a structure that forms part of the front surface 210A in FIG. 2, and the rear surface 210B and the side surface 210C in FIG. 3. For example, the housing 210 may include a front plate 202 and a rear plate 211. According to an embodiment, at least a portion of the front surface 210A may be formed by the front plate 202 (e.g., a glass plate including various coating layers, or a polymer plate) that is substantially transparent. The rear surface 210B may be formed by the rear plate 211. The rear plate 211 may be formed of, for example, glass, ceramic, polymer, metal (e.g., titanium (Ti), stainless steel (STS), aluminum (Al), and/or magnesium (Mg)), or a combination of at least two of the above materials. The side surface 210C may be coupled to the front plate 202 and the rear plate 211 and may be formed by a side bezel structure (or "side member") 218 including metal and/or polymer. In some embodiments, the rear plate 211 and the side bezel structure 218 may be integrally formed and may include the same material (e.g., glass, a metal material such as aluminum, or ceramic). According to an embodiment, the front surface 210A and/or the front plate 202 may be interpreted as a part of the display 220.

According to an embodiment, the electronic device 200 may include at least one or more of a display 220, audio modules 203, 207, and 214 (e.g., the audio module 170 in FIG. 1), a sensor module (e.g., the sensor module 176 in FIG. 1), camera modules 205 and 206 (e.g., the camera module 180 in FIG. 1), a key input device 217 (e.g., the input module 150 in FIG. 1), and connector holes 208 and 209 (e.g., the connection terminal 178 in FIG. 1). In some embodiments, the electronic device 200 may exclude at least one of the elements (e.g., the connector hole 208) or further include other elements. According to an embodiment, the display 220 may be visually exposed (e.g., visible, the terms "visually exposed" and "visible" may be used interchangeably herein) through, for example, a substantial portion of the front plate 202.

According to an embodiment, the surface of the housing 210 (or the front plate 202) may include a screen display area that is formed as the display 220 is visually exposed (e.g., visible). For example, the screen display area may include the front surface 210A.

In an embodiment (not shown), the electronic device 200 may include a recess or opening formed in a portion of the screen display area (e.g., the front surface 210A) of the display 220, and include at least one or more of an audio module 214, a sensor module (not shown), a light-emitting element (not shown), and a camera module 205, which are aligned with the recess or opening. In an embodiment (not shown), at least one or more of an audio module 214, a sensor module (not shown), a camera module 205, a fingerprint sensor (not shown), and a light-emitting element (not shown) may be provided on the rear surface of the screen display area of the display 220.

In an embodiment (not shown), the display 220 may be combined with a touch sensing circuit, a pressure sensor capable of measuring the intensity (pressure) of a touch, and/or a digitizer that detects a magnetic-field type stylus pen, or may be disposed adjacent thereto.

In various embodiments, at least a part of the key input device 217 may be disposed on the side bezel structure 218.

According to an embodiment, the audio modules 203, 207, and 214 may include, for example, a microphone hole 203 and speaker holes 207 and 214. A microphone for obtaining an external sound may be disposed in the microphone hole 203, and in various embodiments, a plurality of microphones may be disposed to detect the direction of a sound. The speaker holes 207 and 214 may include an external speaker hole 207 and a receiver hole 214 for a call. In various embodiments, the speaker holes 207 and 214 and the microphone hole 203 may be implemented as a single hole, or a speaker (e.g., a piezo speaker) may be included without the speaker holes 207 and 214.

According to an embodiment, the sensor module (not shown) may generate electrical signals or data values corresponding to the internal operation state of the electronic device 200 or an external environmental state. The sensor module (not shown) may include, for example, a first sensor module (not shown) (e.g., a proximity sensor) and/or a second sensor module (not shown) (e.g., a fingerprint sensor) disposed on the front surface 210A of the housing 210. The sensor module (not shown) may include a third sensor module (not shown) (e.g., an HRM sensor) and/or a fourth sensor module (not shown) (e.g., a fingerprint sensor) disposed on the rear surface 210B of the housing 210. In various embodiments (not shown), the fingerprint sensor may be disposed on the rear surface 210B of the housing 210, as well as the front surface 210A (e.g., the display 220) thereof. The electronic device 200 may further include at least one of sensor modules (not shown) such as a gesture sensor, a gyro sensor, an atmospheric pressure sensor, a magnetic sensor, an acceleration sensor, a grip sensor, a color sensor, an IR (infrared) sensor, a biometric sensor, a temperature sensor, a humidity sensor, and an illuminance sensor (not shown).

According to an embodiment, the camera modules 205 and 206 may include a front camera module 205 disposed on the front surface 210A of the electronic device 200, and a rear camera module 206 and/or a flash 204 disposed on the rear surface 210B. The camera modules 205 and 206 may include one or more lenses, an image sensor, and/or an image signal processor. The flash 204 may include, for example, a light-emitting diode or a xenon lamp. In various embodiments, two or more lenses (infrared camera, and wide-angle and telephoto lenses) and image sensors may be disposed on one surface of the electronic device 200.

According to an embodiment, the key input device 217 may be disposed on the side surface 210C of the housing 210. In an embodiment, the electronic device 200 may exclude part or all of the above-mentioned key input device 217, and the excluded key input device 217 may be implemented in other forms such as soft keys or the like on the display 220.

According to an embodiment, the light-emitting element (not shown) may be disposed, for example, on the front surface 210A of the housing 210. The light-emitting element (not shown) may provide state information of the electronic device 200, for example, in the form of light. In an embodiment, the light-emitting element (not shown) may provide, for example, a light source that is associated with the operation of the front camera module 205. The light-emitting element (not shown) may include, for example, an LED, an IR LED, and/or a xenon lamp.

According to an embodiment, The connector holes 208 and 209 may include, for example, a first connector hole 208 capable of accommodating a connector (e.g., a USB connector) for transmitting and receiving power and/or data to and from an external electronic device or a connector (e.g., an earphone jack) for transmitting and receiving audio signals to and from an external electronic device, and/or a second connector hole 209 capable of accommodating a storage device (e.g., a SIM (subscriber identification module) card). According to an embodiment, the first connector hole 208 and/or the second connector hole 209 may be omitted.

Figure 4:
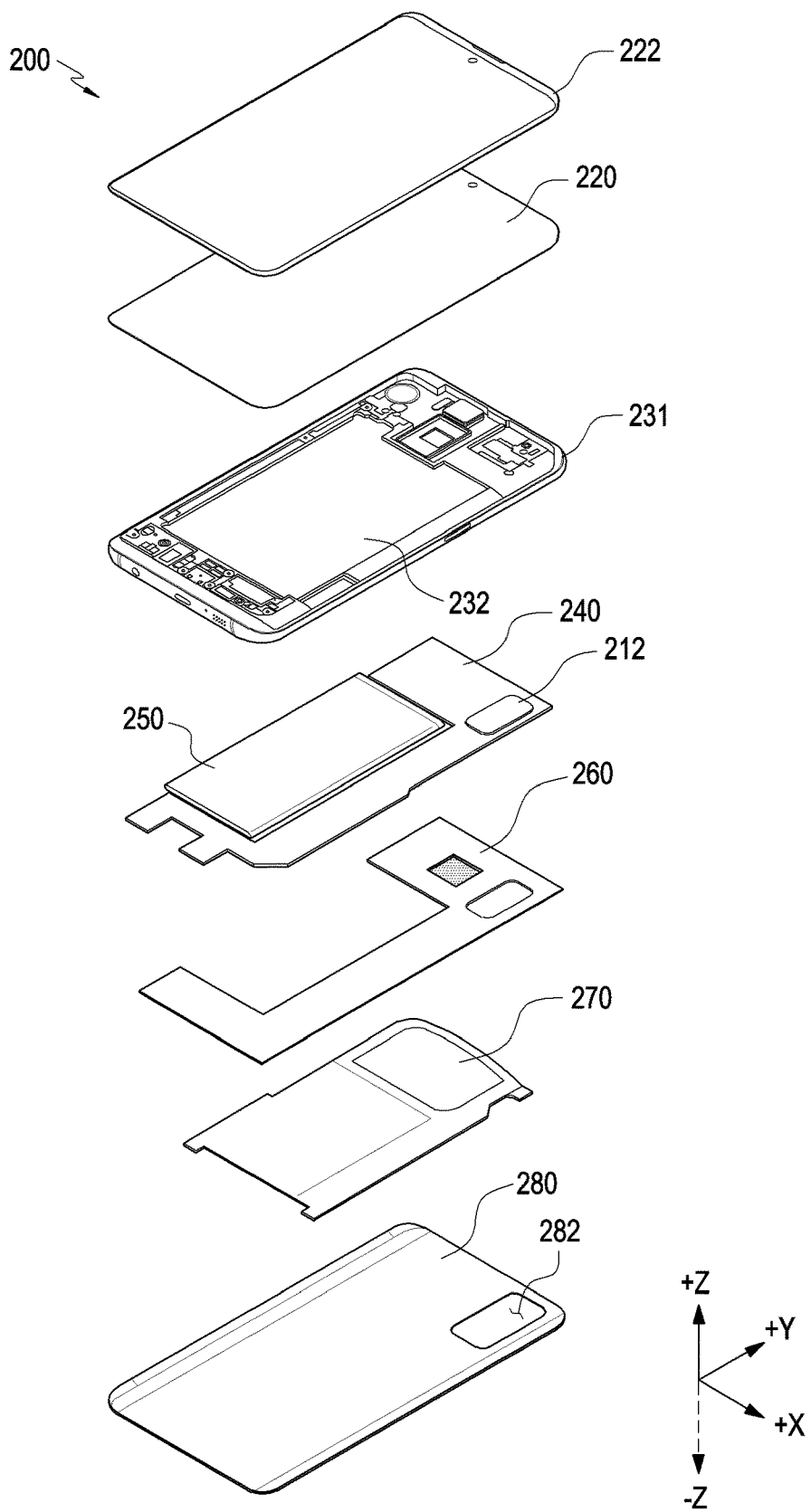
FIG. 4 is an exploded perspective view of an electronic device according to various embodiments.

FIG. 4 is an exploded perspective view of an electronic device according to various embodiments.

Referring to FIG. 4, an electronic device 200 (e.g., the electronic device 200 in FIGS. 2 to 3) may include at least one of a front plate 222 (e.g., the front plate 202 in FIG. 2), a display 220 (e.g., the display 220 in FIG. 2), a bracket 232 (e.g., a front support member), a printed circuit board 240, a battery 250, a rear case 260 (e.g., a rear support member), an antenna 270, and a rear plate 280 (e.g., the rear plate 211 in FIG. 3). In various embodiments, the electronic device 200 may exclude at least one (e.g., the rear case 260) of the elements or further include other elements. At least one of the elements of the electronic device 200 may be the same as or similar to at least one of the elements of the electronic device 200 in FIG. 2 or 3, and duplicate descriptions thereof may not be repeated.

According to an embodiment, the bracket 232 may be disposed inside the electronic device 200 to be connected to the side bezel structure 231 or to be integrally formed with the side bezel structure 231. The bracket 232 may be formed of, for example, a metal material and/or a non-metal (e.g., polymer) material. The bracket 232 may accommodate the display 220 on one surface thereof and accommodate the printed circuit board 240 on the opposite surface thereof. A processor (e.g., the processor 120 in FIG. 1), a memory (e.g., the memory 130 in FIG. 1), and/or an interface (e.g., the interface 177 in FIG. 1) may be mounted on the printed circuit board 240.

According to an embodiment, the battery 250 is a device for supplying power to at least one element (e.g., the camera module 212) of the electronic device 200, and may include, for example, a non-rechargeable primary battery, a rechargeable secondary battery, or a fuel cell. At least a portion of the battery 250 may be disposed on the same plane as, for example, the printed circuit board 240. The battery 250 may be integrally disposed inside the electronic device 200, or may be disposed detachably from the electronic device 200.

According to an embodiment, the rear case 260 may be disposed between the printed circuit board 240 and the antenna 270. For example, the rear case 260 may include one surface to which at least one of the printed circuit board 240 and the battery 250 is coupled, and the opposite surface to which the antenna 270 is coupled.

According to an embodiment, the antenna 270 may be disposed between the rear plate 280 and the battery 250. The antenna 270 may include, for example, an NFC (near field communication) antenna, a wireless charging antenna, and/or an MST (magnetic secure transmission) antenna. For example, the antenna 270 may perform short-range communication with an external device or wirelessly transmit/receive power required for charging. For example, the antenna 270 may include a coil for wireless charging. In an embodiment, an antenna structure may be formed by a part of the side bezel structure 231 and/or the bracket 232 or a combination thereof.

According to various embodiments, the electronic device 200 may include a camera module 212 disposed inside a housing (e.g., the housing 210 in FIG. 2). According to an embodiment, the camera module 212 may be disposed on the bracket 232, and may be a rear camera module (e.g., the camera module 212 in FIG. 3) capable of obtaining an image of a subject positioned at the rear (e.g., the −Z direction) of the electronic device 200. According to an embodiment, at least a portion of the camera module 212 may be exposed to the outside of the electronic device 200 through an opening 282 formed in the rear plate 280.

Although the electronic device 200 shown in FIGS. 2 to 4 are configured in a bar type or plate type, the disclosure is not limited thereto. For example, the illustrated electronic device may be a rollable electronic device or a foldable electronic device (e.g., the electronic device 500 in FIG. 12). The term "rollable electronic device" may indicate an electronic device of which at least a portion is able to be wound or rolled or to be received inside a housing (e.g., the housing 210 in FIG. 2) because a display (e.g., the display 220 in FIG. 4) is bendable. According to user needs, the rollable electronic device may be used by expanding a screen display area by unfolding the display or exposing a larger area of the display to the outside.

Figure 5A:
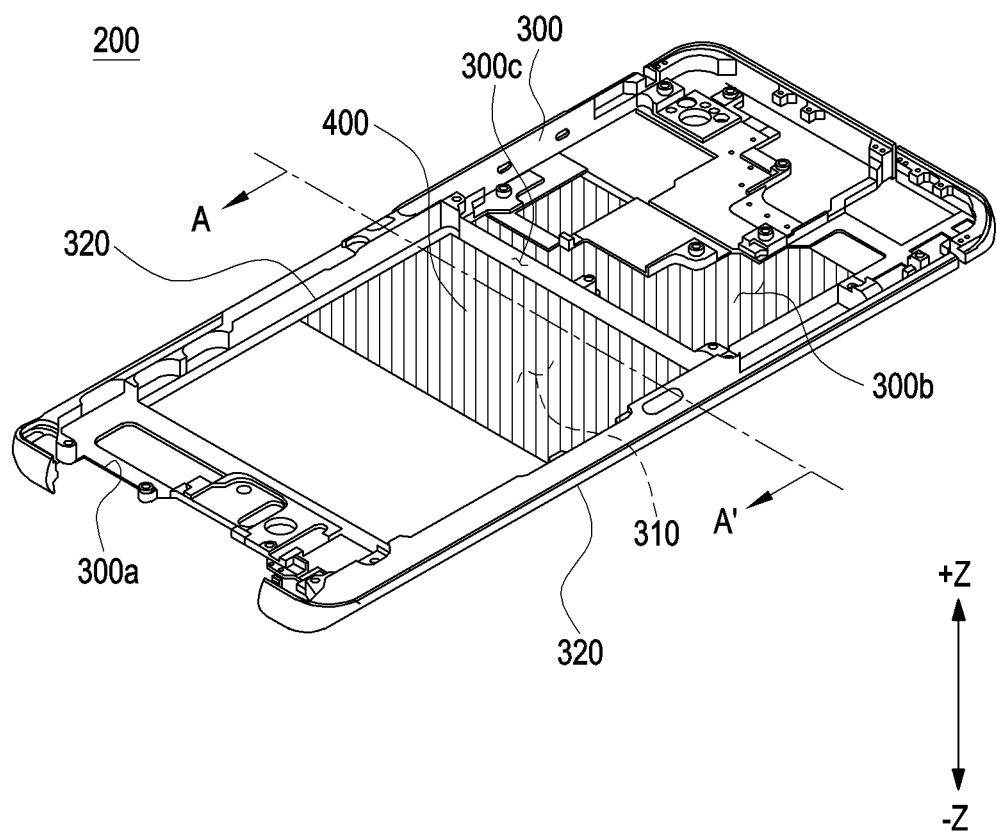
FIG. 5A is a front perspective view of an electronic device including a heat dissipation structure and a support member according to various embodiments.
Figure 5B:
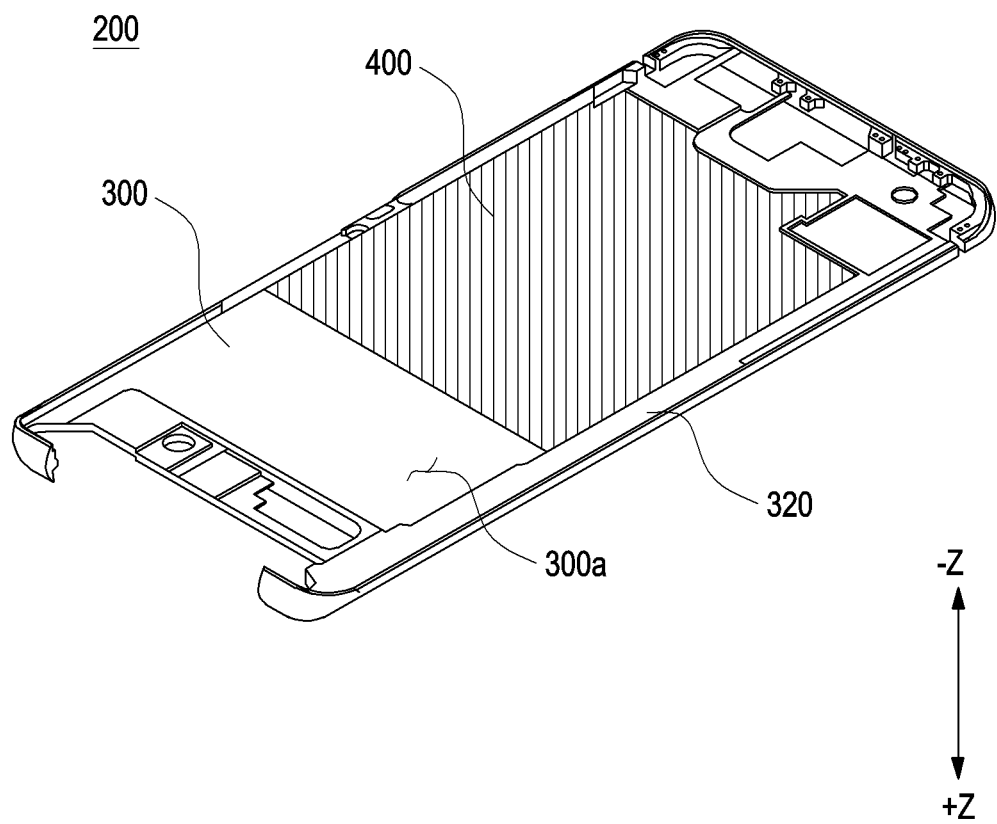
FIG. 5B is a rear perspective view of an electronic device including a heat dissipation structure and a support member according to various embodiments.
Figure 5C:
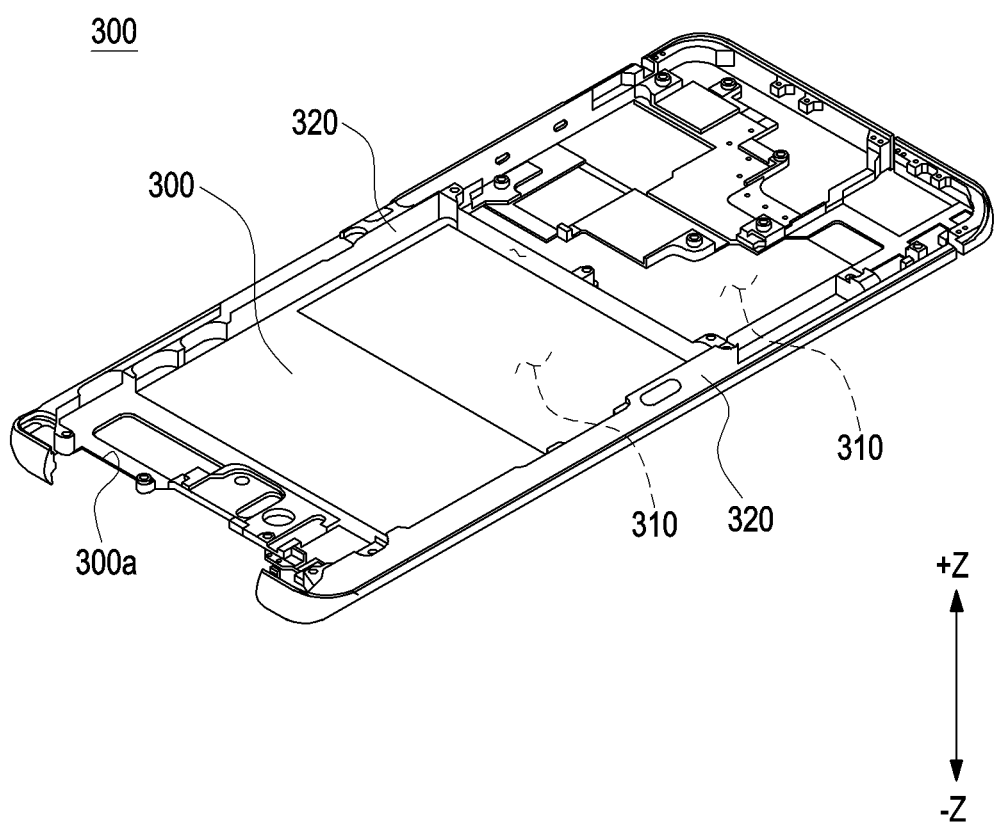
FIG. 5C is a front perspective view of a support member according to various embodiments.
Figure 5D:
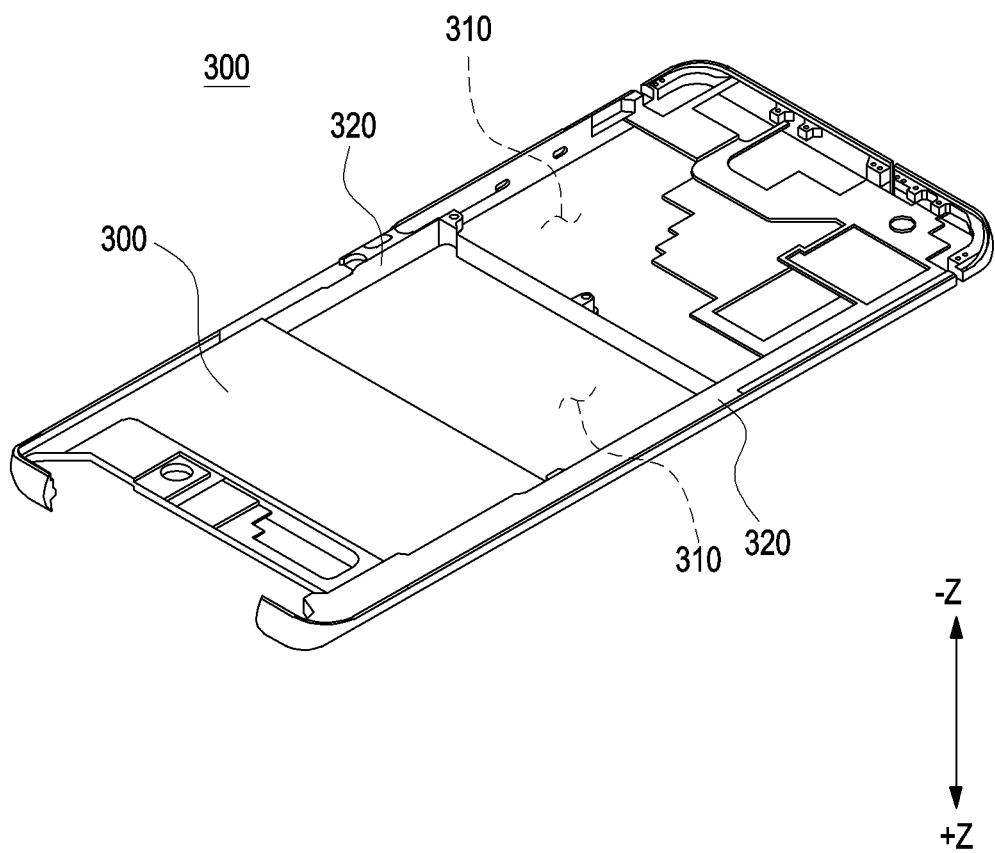
FIG. 5D is a rear perspective view of a support member according to various embodiments.
Figure 6:
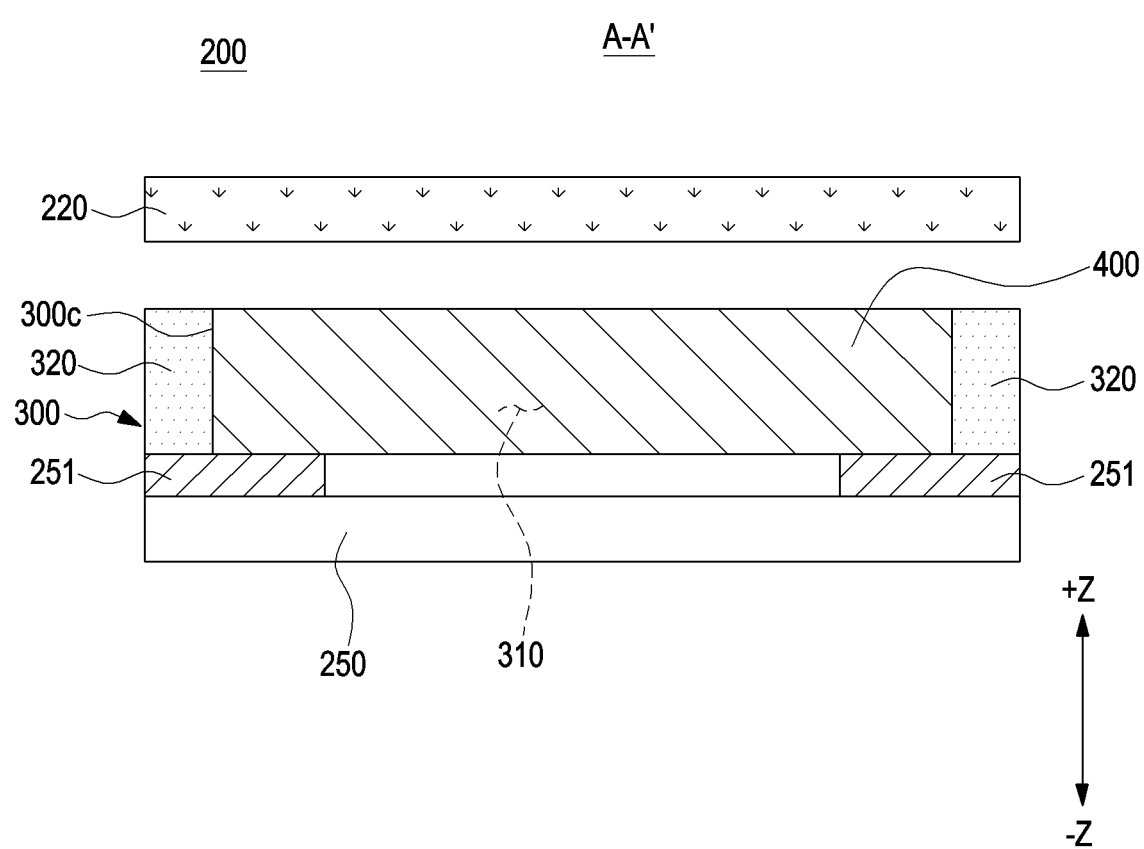
FIG. 6 is a cross-sectional view of an electronic device according to various embodiments.

FIG. 5A is a front perspective view of an electronic device including a heat dissipation structure and a support member according to various embodiments. FIG. 5B is a rear perspective view of an electronic device including a heat dissipation structure and a support member according to various embodiments. FIG. 5C is a front perspective view of a support member according to various embodiments. FIG. 5D is a rear perspective view of a support member according to various embodiments. FIG. 6 is a cross-sectional view of an electronic device according to various embodiments.

Referring to FIGS. 5A, 5B, 5C, 5D and 6 (which may be referred to as FIGS. 5A to 6), the electronic device 200 may include a support member 300 and a heat dissipation structure 400. All or a part of the configurations of the support member 300 in FIGS. 5A to 6 may be the same as or similar to the configurations of the bracket 232 in FIG. 4.

According to various embodiments, the support member 300 may include at least one through-hole (it will be understood that the term "through hole" encompasses any structure capable of providing the features set forth herein, including, but not limited to, a recess, a depression, a hole, an opening, or the like) 310. According to an embodiment, at least a portion of the through-hole 310 may face a component (e.g., the battery 250 and/or the printed circuit board 240 in FIG. 4) of the electronic device 200. For example, the battery 250 may be connected to the support member 300 using an adhesive member 251. According to an embodiment, the support member 300 may include a front surface 300*a* facing the front (e.g., the +Z direction) of the electronic device 200 and a rear surface 300*b* facing the rear (e.g., the −Z direction) of the electronic device 200. The through-hole 310 may be interpreted as an empty space passing through the front surface 300*a* and the rear surface 300*b* of the support member 300. The term through-hole may also be understood to encompass any suitable structure, including, for example, and without limitation, a hole, an opening, a recess, a depression, etc. According to an embodiment, the support member 300 may be disposed between the display 220 and the battery 250.

According to various embodiments, the support member 300 may include a side wall structure 320. According to an embodiment, the side wall structure 320 may surround at least a portion of the through-hole 310. According to an embodiment, the side wall structure 320 may form an inner surface 300c substantially perpendicular to the front surface 300a and/or the rear surface 300b of the support member 300. According to an embodiment, the side wall structure 320 may be interpreted as a part of the support member 300 surrounding the through-hole 310.

According to various embodiments, the electronic device 200 may include a heat dissipation structure 400. According to an embodiment, the heat dissipation structure 400 may dissipate heat generated from the electronic components to other elements of the electronic device 200. According to an embodiment, the heat generated by the processor 120 may be transferred to a battery (e.g., the battery 250 in FIG. 4) through the heat dissipation structure 400. According to an embodiment, the heat generated from a heat source (e.g., the processor 120) of the electronic device 200 may dissipate through the heat dissipation structure 400, thereby reducing the maximum temperature of the electronic device 200.

According to various embodiments, the heat dissipation structure 400 may support at least some of the components of the electronic device 200. For example, the heat dissipation structure 400 may form substantially the same plane as the front surface 300a and/or the rear surface 300b of the support member 300. According to an embodiment, the heat dissipation structure 400 may be positioned in a portion of the support member 300 facing the battery (e.g., the battery 250 in FIG. 4). According to an embodiment, the heat dissipation structure 400 may be connected to the support member 300. For example, the heat dissipation structure 400 may be bonded to the side wall structure 320. According to an embodiment, the heat dissipation structure 400 may be positioned in the through-hole 310.

Figure 7A:
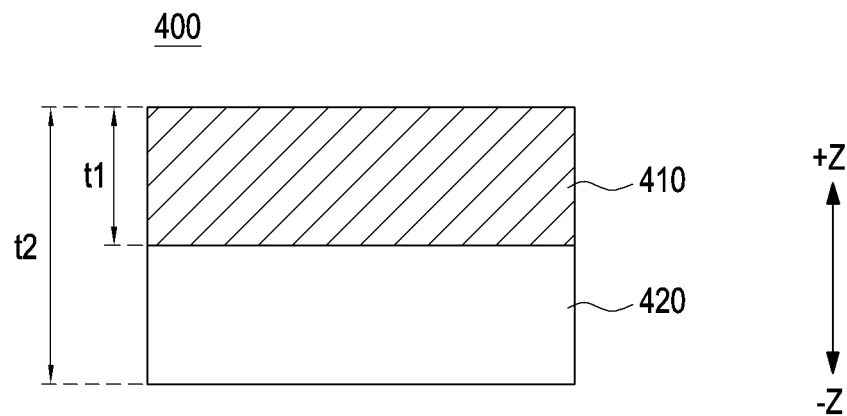
FIGS. 7A and 7B are cross-sectional views of a heat dissipation structure according to various embodiments.
Figure 7B:
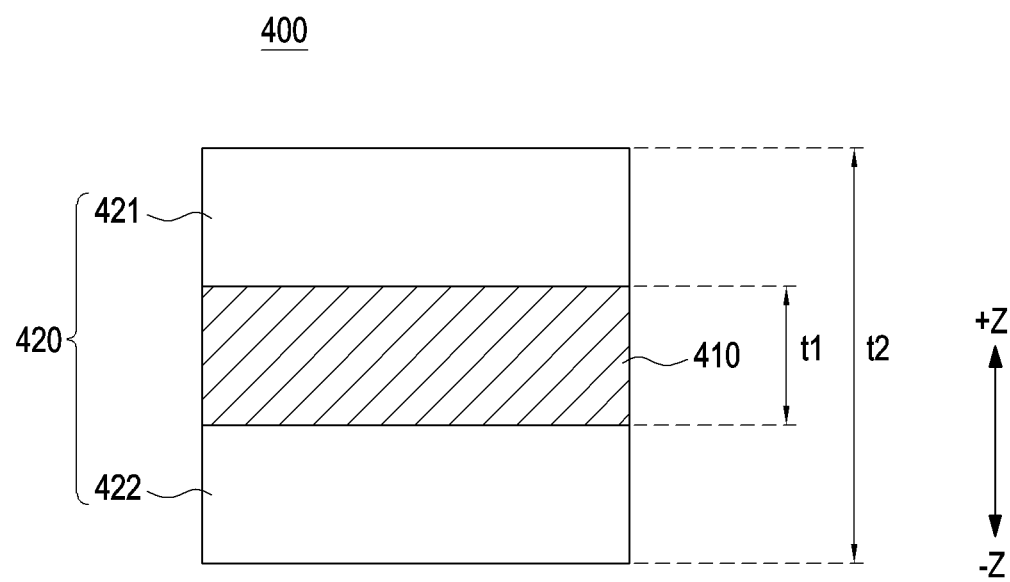

FIGS. 7A and 7B are cross-sectional views of a heat dissipation structure according to various embodiments.

Referring to FIGS. 7A and 7B, the heat dissipation structure 400 may include a heat dissipation layer 410 and a protective layer 420. All or a part of the configurations of the heat dissipation structure 400 in FIGS. 7A and 7B may be the same as or similar to the configurations of the heat dissipation structure 400 in FIGS. 5A to 6.

According to various embodiments, the heat dissipation structure 400 may be a clad in which the heat dissipation layer 410 and the protective layer 420 are bonded. For example, the heat dissipation structure 400 may be interpreted as one component (e.g., a plate) in which the heat dissipation layer 410 and the protective layer 420 are combined. According to an embodiment, the heat dissipation structure 400 may be formed as a clad using, for example, roll bonding (e.g., reel-to-reel bonding). For example, the extruded heat dissipation layer 410 and protective layer 420 may be pressed using a roller. The pressed heat dissipation layer 410 and protective layer 420 may be plastically deformed to reduce their thickness, thereby forming a heat dissipation structure 400 that is a clad. According to an embodiment, the heat dissipation structure 400 may be formed as a clad using explosive bonding. For example, the heat dissipation layer 410 and the protective layer 420 may be bonded using the energy generated by explosion of an explosive. According to an embodiment, the heat dissipation structure 400 may be formed as a clad using laser overlaying. For example, metal powder and/or wires melted using a laser may be coated on the heat dissipation layer 410 and the protective layer 420.

According to various embodiments, the protective layer 420 may surround at least a portion of the heat dissipation layer 410. For example, the protective layer 420 may be disposed on and/or under the heat dissipation layer 410.

According to various embodiments, the heat dissipation layer 410 may increase thermal conductance of the heat dissipation structure 400. For example, more than half of the heat transferred to the heat dissipation structure 400 may be transferred to the outside of the heat dissipation structure 400 through the heat dissipation layer 410. According to an embodiment, the first thermal conductivity of the heat dissipation layer 410 may be greater than the second thermal conductivity of the protective layer 420. The thermal conductance is the degree to which an object having a specific size and shape actually transfers heat, and the unit thereof may be W/K. The thermal conductivity is an intrinsic property of an object, and the unit thereof may be W/mK.

According to various embodiments, the protective layer 420 may increase strength and/or rigidity of the heat dissipation structure 400. According to an embodiment, the second modulus of elasticity of the protective layer 420 may be greater than the first modulus of elasticity of the heat dissipation layer 410. According to an embodiment, the second yield strength of the protective layer 420 may be greater than the first yield strength of the heat dissipation layer 410.

According to an embodiment, the heat dissipation layer 410 may be a copper alloy, an aluminum alloy, or a magnesium alloy. For example, the heat dissipation layer 410 may include at least one of copper, aluminum, or magnesium.

According to an embodiment, the protective layer 420 may be stainless steel, a magnesium alloy, a titanium alloy, or an aluminum alloy. For example, the protective layer 420 may include at least one of stainless steel, aluminum, titanium, or magnesium.

According to an embodiment, the material of the heat dissipation layer 410 and the material of the protective layer 420 may be different from each other. For example, in the case where the heat dissipation layer 410 is formed of an aluminum alloy and where the protective layer 420 is formed of an aluminum alloy, the thermal conductance of the aluminum alloy of the heat dissipation layer 410 may be greater than the thermal conductance of the aluminum alloy of the protective layer 420.

According to various embodiments, the protective layer 420 may include a first protective layer 421 and a second protective layer 422. For example, the protective layer 420 may include a first protective layer 421 disposed on the heat dissipation layer 410 (e.g., in the +Z direction) and a second protective layer 422 disposed under the heat dissipation layer 410 (e.g., in the −Z direction). According to an embodiment, the heat dissipation layer 410 may be disposed between the first protective layer 421 and the second protective layer 422. The first protective layer 421 and the second protective layer 422 may protect the heat dissipation layer 410 from external impact. According to an embodiment, the material of the first protective layer 421 and the material of the second protective layer 422 may be different from each other. For example, the first protective layer 421 may include stainless steel, and the second protective layer 422 may include a titanium alloy.

According to various embodiments, the heat dissipation structure 400 may include at least one auxiliary heat dissipation layer (not shown). According to an embodiment, the auxiliary heat dissipation layer may be disposed between the heat dissipation layer 410 and the protective layer 420. For example, the auxiliary heat dissipation layer may include at least one of a first protective heat dissipation layer (not shown) disposed between the first protective layer 421 and the heat dissipation layer 410 or a second protective heat dissipation layer (not shown) disposed between the second protective layer 421 and the heat dissipation layer 410. According to an embodiment, the auxiliary heat dissipation layer may have a third thermal conductivity (heat conductivity) lower than the first thermal conductivity of the heat dissipation layer 410 and higher than the second thermal conductivity of the protective layer 420. For example, in the heat dissipation structure 400, the protective layer 420 may include stainless steel, the heat dissipation layer 410 may include copper, and the auxiliary heat dissipation layer may include aluminum.

According to various embodiments, the thermal conductance of the heat dissipation structure 400 may vary based on the ratio of the heat dissipation layer 410 to the heat dissipation structure 400. According to an embodiment, based on a ratio of the thickness of the heat dissipation layer 410 to the thickness of the protective layer 420, the thermal conductance of the heat dissipation structure 400 may vary. According to an embodiment, the second thickness t2 of the heat dissipation structure 400 may, for example, be in a range of 0.01 mm to 1 mm. According to an embodiment, the first thickness t1 of the heat dissipation layer 410 may be ⅓ to ⅔ of the second thickness t2 of the heat dissipation structure 400. According to an embodiment, the first thickness t1 of the heat dissipation layer 410 may, for example, be about 0.3 mm.

Figure 8A:
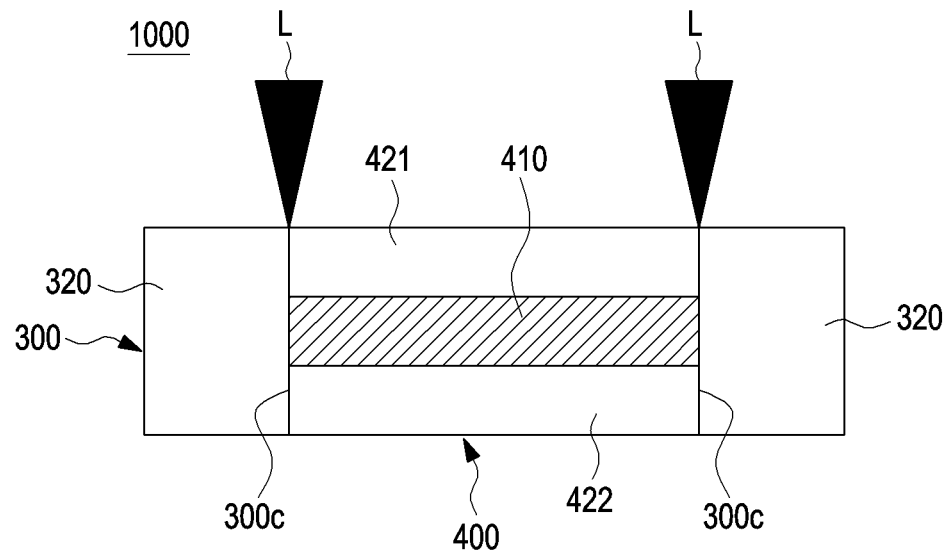
FIGS. 8A, 8B, and 8C are diagrams illustrating an example method of coupling a support member including metal and a heat dissipation structure according to various embodiments.
Figure 8B:
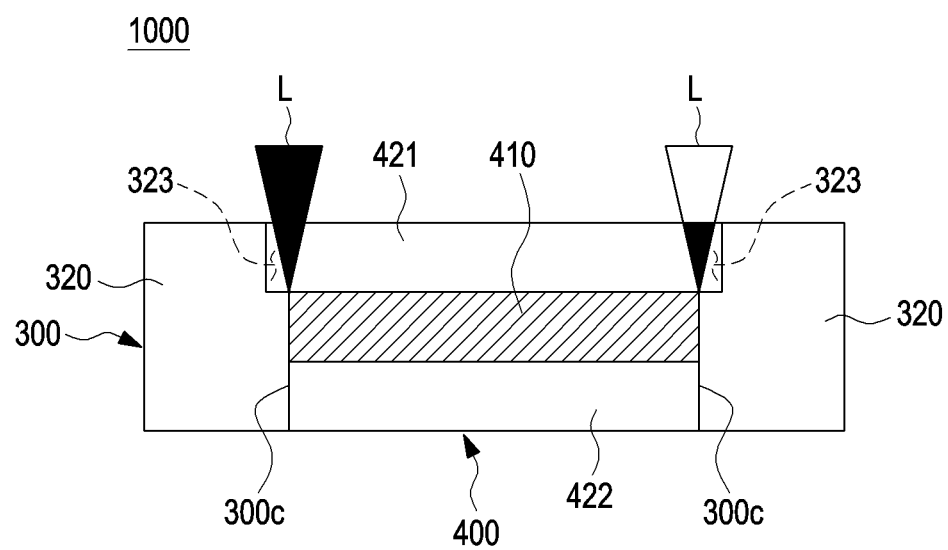
Figure 8C:
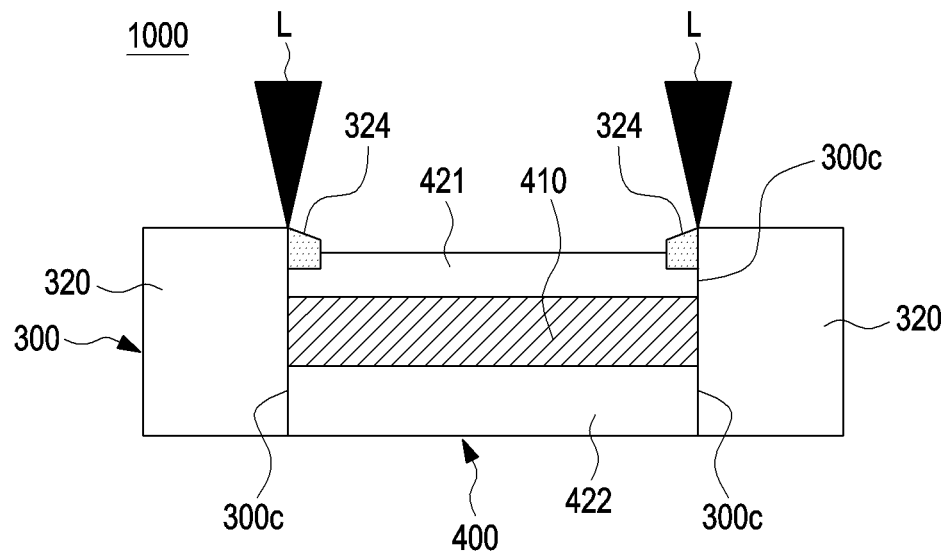

FIGS. 8A, 8B, and 8C are diagrams illustrating an example method 1000 of coupling a support member including metal and a heat dissipation structure according to various embodiments.

Referring to FIGS. 8A, 8B, and 8C, a method 1000 of coupling the support member 300 and the heat dissipation structure 400 may include a process of bonding the support member 300 and the heat dissipation structure 400. All or a part of the configurations of the support member 300 and the heat dissipation structure 400 in FIGS. 8A, 8B, and 8C may be the same as or similar to the configurations of the support member 300 and the heat dissipation structure 400 in FIG. 4.

According to various embodiments, the heat dissipation structure 400 may be bonded to the support member 300. For example, the heat dissipation structure 400 may be bonded to a portion (e.g., the side wall structure 320) of the support member 300 using a laser L. According to an embodiment, the heat dissipation structure 400 may be welded to the support member 300, and the heat dissipation structure 400 may be interpreted as one part connected to the support member 300.

According to an embodiment, the support member 300 may be formed of metal. For example, the support member 300 may include at least one of stainless steel, aluminum, magnesium, or titanium.

According to various embodiments (e.g., FIG. 8A), the heat dissipation structure 400 may be bonded to the support member 300 using butt welding. For example, the heat dissipation layer 410 and the protective layers 421 and 422 of the heat dissipation structure 400 may be irradiated with a laser L in the state of being in direct contact with the inner surface 300c of the side wall structure 320.

According to various embodiments (e.g., FIG. 8B), the heat dissipation structure 400 may be bonded to the support member 300 using overlapping welding. According to an embodiment, at least a portion (e.g., the first protective layer 421) of the heat dissipation structure 400 may be irradiated with a laser L in the state of being disposed on the side wall structure 320 (e.g., in the +Z direction). According to an embodiment, the side wall structure 320 of the support member 300 may include a groove 323 for receiving at least a portion of the heat dissipation structure 400. A portion of the side wall structure 320 forming the groove 323 may be bonded to a portion (e.g., the first protective layer 421) of the heat dissipation structure 400.

According to various embodiments (e.g., FIG. 8C), the heat dissipation structure 400 may be bonded to the support member 300 using fillet welding. For example, the electronic device (e.g., the electronic device 200 in FIG. 2) may include a metal (e.g., solder) 324 positioned at a point where the support member 300 and the heat dissipation structure 400 overlap, and a portion (e.g., the first protective layer 421) of the heat dissipation structure 400 may be connected to the support member 300 using a metal 324 melted by a laser L.

Figure 9:
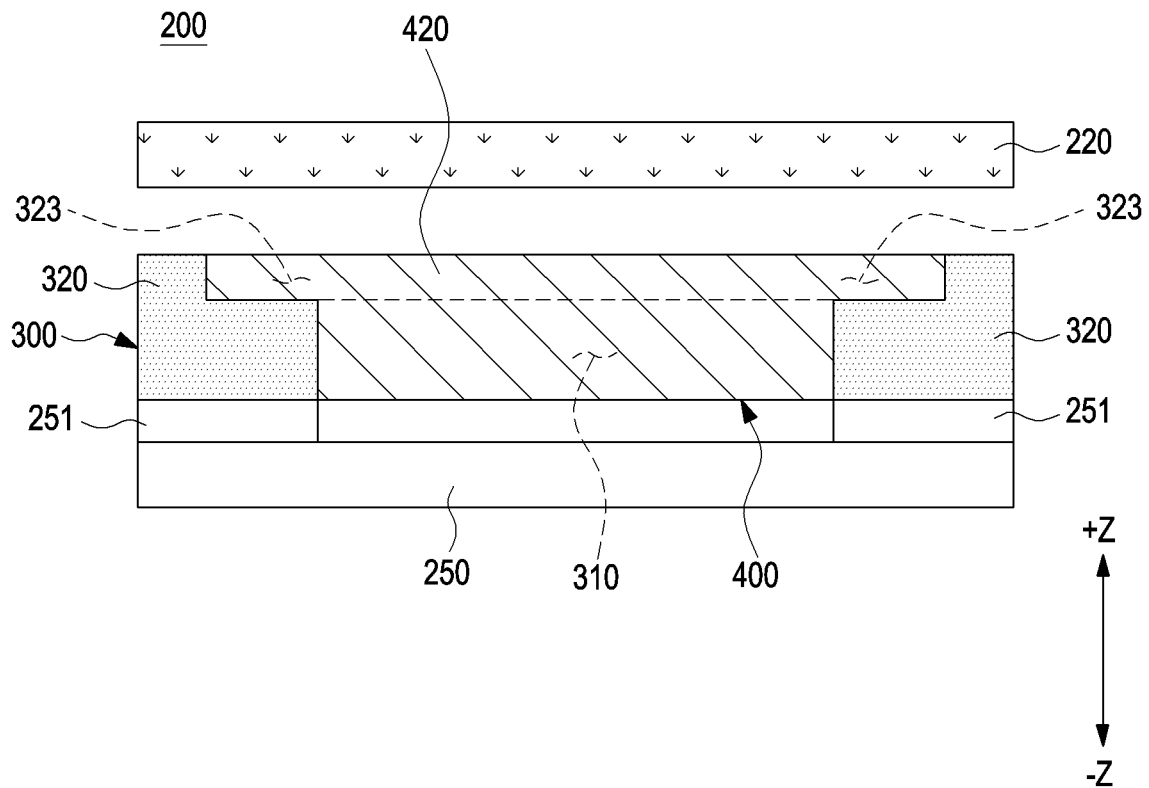
FIG. 9 is a cross-sectional view of an electronic device according to various embodiments.
Figure 10A:
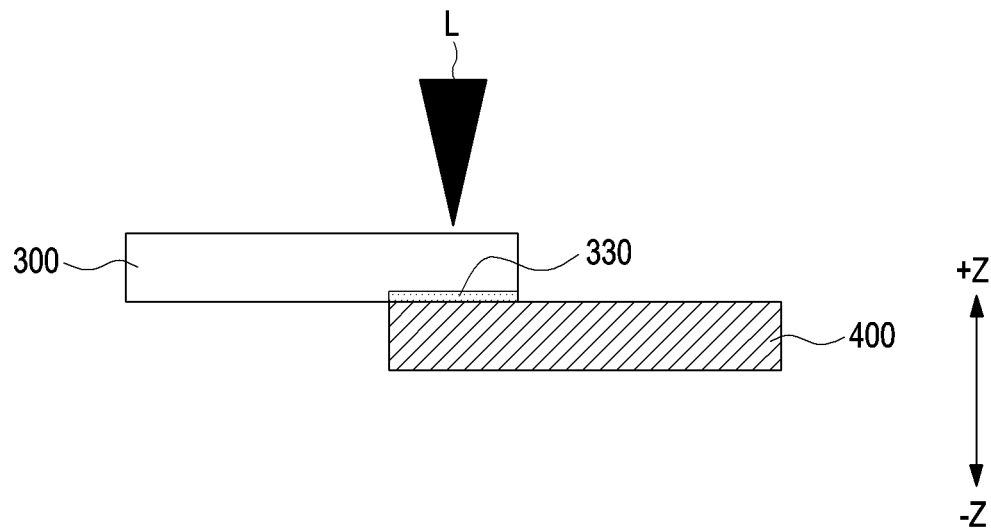
FIGS. 10A and 10B are diagrams illustrating an example method of coupling a support member including resin and a heat dissipation structure according to various embodiments.
Figure 10B:
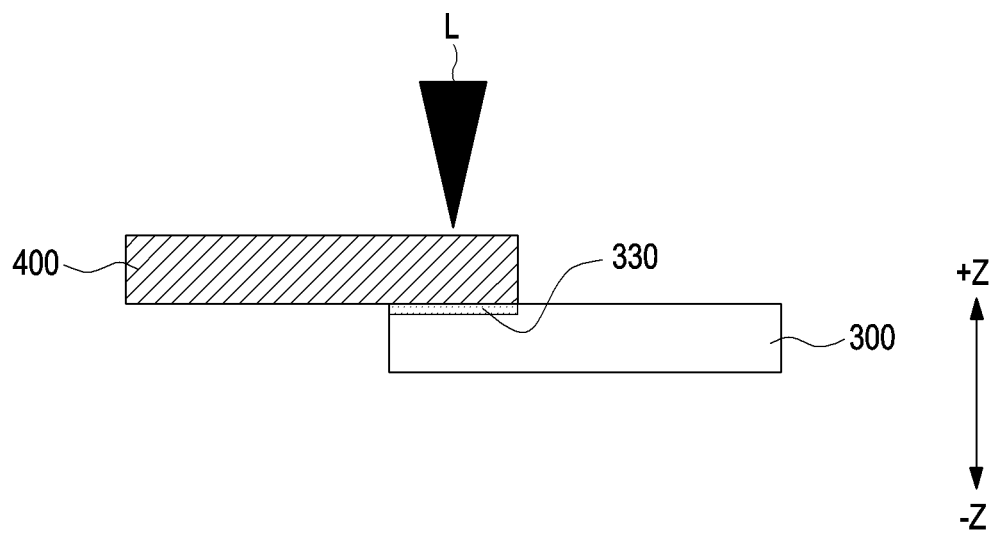
Figure 11:
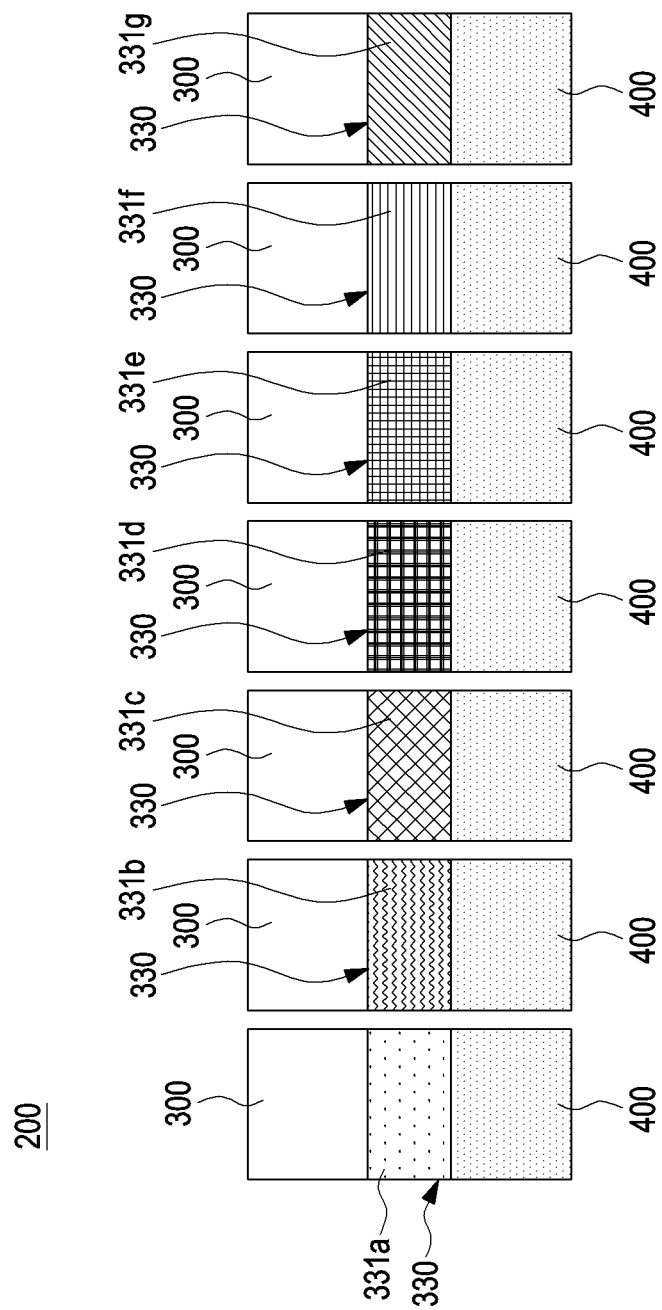
FIG. 11 is a diagram illustrating an overlapping area of a support member according to various embodiments.

FIG. 9 is a cross-sectional view of an electronic device according to various embodiments. FIGS. 10A and 10B are diagrams illustrating an example method of coupling a support member including resin and a heat dissipation structure according to various embodiments. FIG. 11 is a diagram illustrating an overlapping area of a support member according to various embodiments.

Referring to FIGS. 9, 10A, 10B, and 11, the electronic device 200 may include a support member 300 and a heat dissipation structure 400 bonded to the support member 300. All or a part of the configurations of the support member 300 and the heat dissipation structure 400 in FIGS. 9, 10A, 10B and 11 may be the same as or similar to the configurations of the support member 300 and the heat dissipation structure 400 in FIGS. 5A to 5B.

According to various embodiments, the support member 300 may include a resin. For example, the support member 300 may include polycarbonate. According to an embodiment, the support member 300 may include a groove 323 capable of receiving at least a portion (e.g., the protective layer 420) of the heat dissipation structure 400.

According to various embodiments, the support member 300 and the heat dissipation structure 400 may be bonded using laser radiation heat. For example, the support member 300 may be heated above the melting point by the laser radiation heat.

According to various embodiments, the support member 300 may include an overlapping area 330 in contact with at least a portion (e.g., the protective layer 420) of the heat dissipation structure 400. According to an embodiment, the overlapping area 330 may be interpreted as an area where the support member 300 and the heat dissipation structure 400 melted by the radiation heat of a laser L are bonded. According to an embodiment, the overlapping area 330 may form at least a portion of the groove 323 of the support member 300.

According to an embodiment, the support member 300 and/or the heat dissipation structure 400 may be pressed and wetted. For example, the support member 300 melted by the laser may be dispersed between the support member 300 and the heat dissipation structure 400.

According to various embodiments (e.g., FIG. 10A), at least a portion of the laser L may be transmitted to the heat dissipation structure 400 by passing through the support member 300. For example, at least a portion of the support member 300 may be formed of a substantially transparent material. The laser L may be transmitted to the overlapping area 330 in which the support member 300 and the heat dissipation structure 400 overlap.

According to various embodiments (e.g., FIG. 10B), the laser may be transmitted directly to the heat dissipation structure 400. For example, at least some of the thermal energy of the laser may be transmitted to the overlapping area 330 by thermal conduction through the heat dissipation structure 400.

According to various embodiments, the overlapping area 330 may include an uneven structure 331 to increase the surface areas of the support member 300 and the heat dissipation structure 400. Due to the uneven structure 331, the surface areas of the support member 300 and the heat dissipation structure 400 may be increased, thereby increasing the bonding force between the member 300 and the heat dissipation structure 400. According to an embodiment, the uneven structure 331 may be formed in a shape protruding or recessed from the support member 300.

According to various embodiments, the uneven structure 331 may be formed in various shapes. For example, the uneven structure 331 may be a structure 331a of a plurality of spaced dots, wave-patterned protrusions 331b, checkered protrusions 331c, 331d, and 331e, or structures 331f and 331g of a plurality of stripes arranged in one direction.

Figure 12:
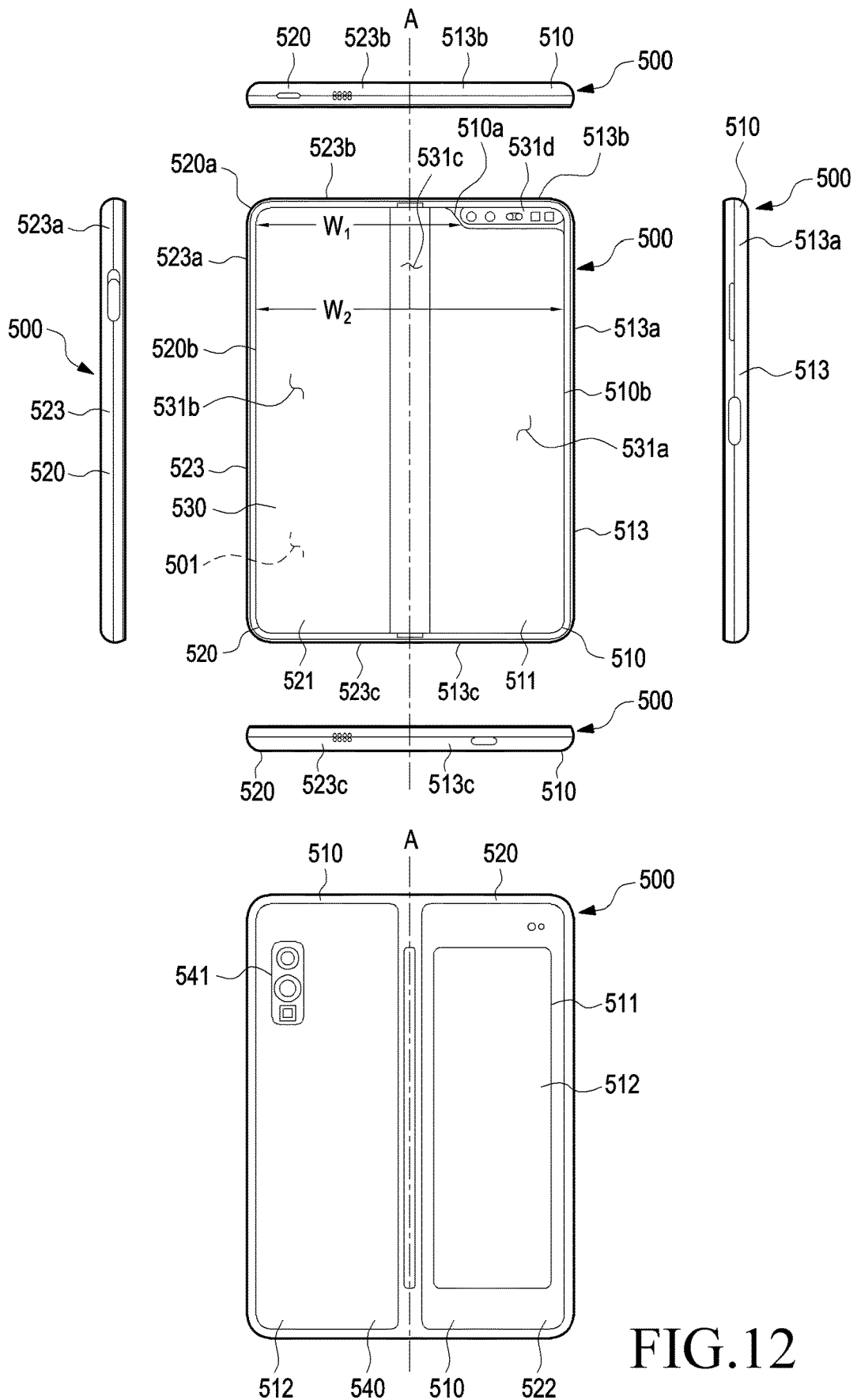
FIG. 12 is a diagram illustrating an unfolded state of a foldable electronic device according to various embodiments.
Figure 13:
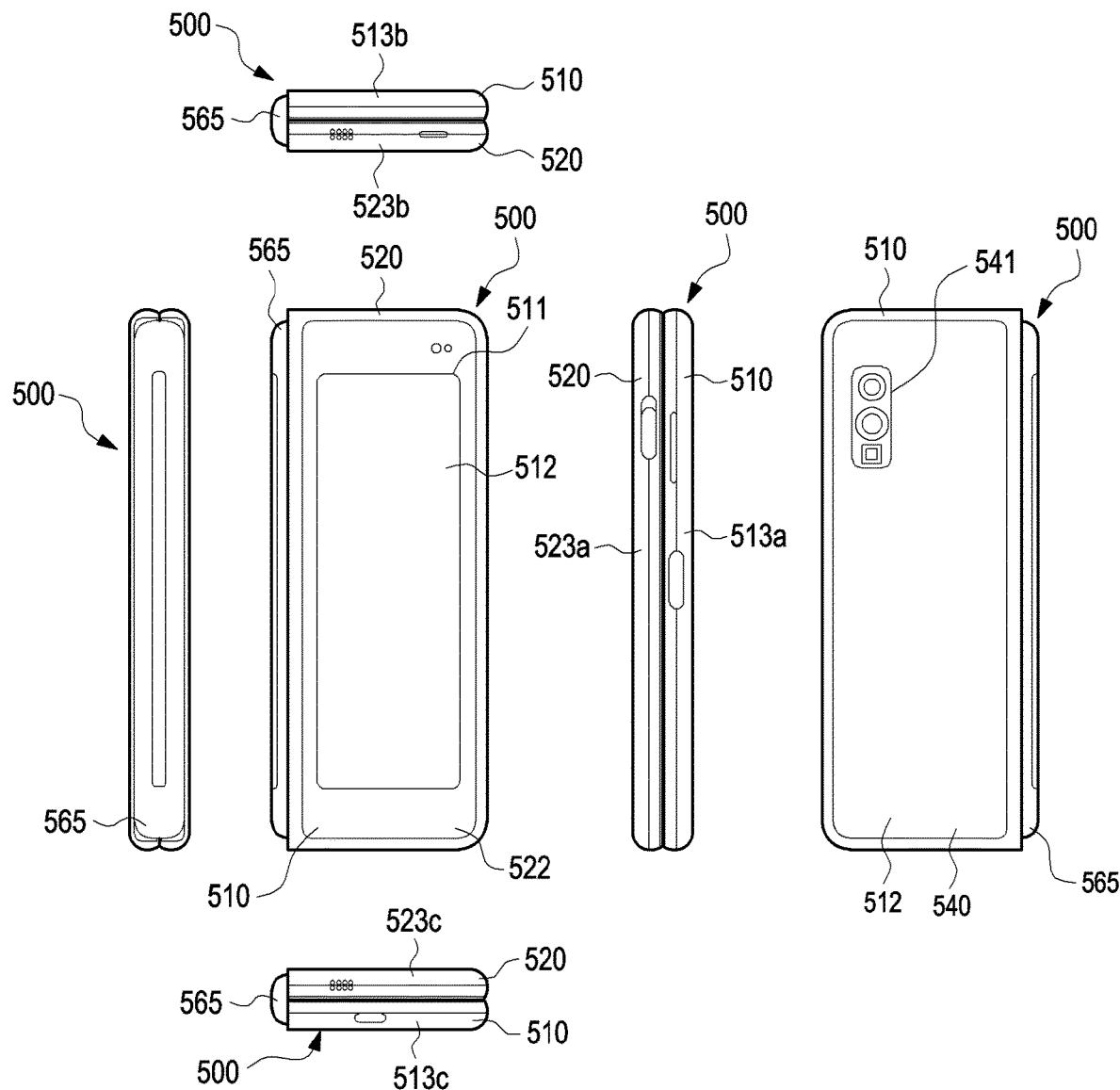
FIG. 13 is a diagram illustrating a folded state of a foldable electronic device according to various embodiments.

FIG. 12 is a diagram illustrating an unfolded state of a foldable electronic device according to various embodiments. FIG. 13 is a diagram illustrating a folded state of a foldable electronic device according to various embodiments.

Referring to FIGS. 12 and 13, an electronic device 500 may be a foldable electronic device. The electronic device 500 in FIGS. 12 and 13 may include housings 510 and 520 and a display 530. All or a part of the configurations of the electronic device 500, the housings 510 and 520, and the display 530 in FIGS. 12 and 13 may be the same as or similar to the configurations of the electronic device 200, the housing 210, and the display 220 in FIGS. 2 and 3.

In the following detailed description, a pair of housings (or referred to as "housings") will be illustrated to be rotatably coupled by a hinge module (or referred to as a "hinge structure"). However, it should be noted that this embodiment does not limit the electronic device according to various embodiments disclosed in this disclosure. For example, the electronic device according to various embodiments disclosed in this disclosure may include three or more housings, and "a pair of housings" in the embodiments disclosed below may indicate "two housings, among three or more housings, that are rotatably coupled to each other".

Referring to FIGS. 12 and 13, the electronic device 500 may include a pair of housings 510 and 520 rotatably coupled through a hinge module (e.g., the hinge module 564 in FIG. 14) so as to be folded relative to each other, a hinge cover 565 covering the foldable portion of the pair of housings 510 and 520, and a display 530 (e.g., a flexible display or a foldable display) disposed in a space formed by the pair of housings 510 and 520. In an embodiment, the electronic device 500 may include foldable housings in which a pair of housings 510 and 520 are coupled to rotate from a position where the housings 510 and 520 are folded to face each other to a position where they are unfolded side by side each other. In this disclosure, the surface on which the display 530 is disposed may be referred to, for example, as a front surface of the electronic device 500, and the opposite surface of the front surface may be referred to, for example, as a rear surface of the electronic device 500. In addition, the surface surrounding the space between the front surface and the rear surface may be referred to, for example, as a side surface of the electronic device 500.

In an embodiment, the pair of housings 510 and 520 may include a first housing 510 including a sensor area 531d, a second housing 520, a first rear cover 540, and a second rear cover 550. The pair of housings 510 and 520 of the electronic device 500 is not limited to the form and coupling shown in FIGS. 12 and 13, and may be implemented by a combination and/or coupling of other shapes or parts. For example, in an embodiment, the first housing 510 and the first rear cover 540 may be integrally formed, and the second housing 520 and the second rear cover 550 may be integrally formed. In an embodiment, the first housing 510 may include a first rear cover 540, and the second housing 520 may include a second rear cover 550.

According to an embodiment, the first housing 510 and the second housing 520 may be disposed on both sides of, for example, a folding axis A, and have an overall symmetrical shape with respect to the folding axis A. In various embodiments, the first housing 510 and the second housing 520 may rotate with respect to the hinge module 564 or the hinge cover 565, based on different folding axes. For example, the first housing 510 and the second housing 520 may be rotatably coupled to the hinge module 564 or the hinge cover 565, respectively, and rotate about the folding axis A or about different folding axes between a position where they are folded to each other and a position where they are inclined with each other or a position where they are unfolded side by side with respect to each other.

In this disclosure, "positioned side by side with respect to each other" or "extending side by side from each other" may indicate the state in which two structures (e.g., the housings 510 and 520) are at least partially positioned next to each other or the state in which at least portions adjacent to each other are disposed parallel to each other. In various embodiments, "disposed side by side with respect to each other" may indicate that two structures are positioned next to each other so as to be directed in a parallel direction or in the same direction. Expressions "side by side", "parallel", and the like may be used in the following detailed description, but this will be easily understood according to the shapes or an arrangement relationship of the structures with reference to the accompanying drawings.

According to an embodiment, the first housing 510 and the second housing 520 may have an angle or a distance therebetween, which varies depending on whether the electronic device 500 is in an extended state (a flat state, an unfolding state, or an open state), in a folding state (or a closed state), or in an intermediate state. In describing various embodiments of the disclosure, the "extended state" of the electronic device 500 may indicate a "fully unfolded state" in which the first housing 510 and the second housing 520 of the electronic device form an angle of 180 degrees therebetween. The "closed state" of the electronic device 500 may indicate the state in which the first housing 510 and the second housing 520 of the electronic device form an angle of 0 degrees or an angle of 10 degrees or less therebetween. The "intermediate state" of the electronic device 500 may indicate the state in which the first housing 510 and the second housing 520 form an angle between the angle formed by the first housing 510 and the second housing 520 in the "extended state" and the angle formed by the first housing 510 and the second housing 520 in the "closed state".

According to an embodiment, although the first housing 510, unlike the second housing 520, may further include a sensor area 531d in which various sensors are disposed, the remaining areas may have a symmetrical shape. In an embodiment, the sensor area 531d may be further disposed in at least a partial area of the second housing 520 or may be replaced by the same. In an embodiment, the sensor area 531d may be omitted from the first housing 510.

In an embodiment, the first housing 510 may be connected to a hinge module (e.g., the hinge module 564 in FIG. 14) in the extended state of the electronic device 500, and may include a first surface 511 disposed to face the front of the electronic device 500, a second surface 512 facing in the opposite direction of the first side 511, and a first side member 513 surrounding at least a portion of the space between the first surface 511 and the second surface 512. In an embodiment, the first side member 513 may include a first side surface 513a disposed parallel to the folding axis A, a second side surface 513b extending from one end of the first side surface 513a in a direction perpendicular to the folding axis A, and a third side surface 513c extending from the opposite end of the first side surface 513a in a direction perpendicular to the folding axis A. In describing various embodiments of the disclosure, although the expressions "parallel", "perpendicular", etc. are used for the arrangement relationship of the above-described side surfaces, this may encompass "partially parallel" or "partially perpendicular" according to an embodiment. In various embodiments, the expressions "parallel", "perpendicular", etc. may indicate an arrangement relationship in which inclination is formed at an angle of 10 degrees or less.

In an embodiment, the second housing 520 may be connected to the hinge module (e.g., the hinge module 564 in FIG. 14) and may include a third surface 521 disposed to face the front of the electronic device 500 in the extended state of the electronic device 500, a fourth surface 522 facing in the opposite direction of the third surface 521, and a second side member 523 surrounding at least a portion of the space between the third surface 521 and the fourth surface 522. In an embodiment, the second side member 523 may include a fourth side surface 523a disposed parallel to the folding axis A, a fifth side surface 523b extending from one end of the fourth side surface 523a in a direction perpendicular to the folding axis A, and a sixth side surface 523c extending from the opposite end of the fourth side surface 523a in a direction perpendicular to the folding axis A. In an embodiment, the third surface 521 may be disposed to face the first surface 511 in the folded state. In various embodiments, although there are some differences in a specific shape, the second side member 523 may be manufactured in substantially the same shape or material as the first side member 513.

In an embodiment, the electronic device 500 may include a recess 501 formed to receive the display 530 through the structural shape coupling of the first housing 510 and the second housing 520. The recess 501 may have substantially the same size as the display 530. In an embodiment, due to the sensor area 531d, the recess 501 may have at least two different widths in a direction perpendicular to the folding axis A. For example, the recess 501 may have a first width W1 formed between a first portion 520a of the second housing 520, which is parallel to the folding axis A, and a first portion 510a of the first housing 510, which is formed at the edge of the sensor area 531d, and a second width W2 formed between a second portion 520b of the second housing 520 and a second portion 510b of the first housing 510, which does not belong to the sensor area 531d and is parallel to the folding axis A. In this case, the second width W2 may be formed to be greater than the first width W1. For example, the recess 501 may be formed to have a first width W1 formed between the first portion 510a of the first housing 510, which has an asymmetric shape, and the first portion 520a of the second housing 520, and a second width W2 formed between the second portion 510b of the first housing 510, which has a symmetrical shape, and the second portion 520b of the second housing 520. In an embodiment, the first portion 510a and the second portion 510b of the first housing 510 may be formed to have different distances from the folding axis A. The width of the recess 501 is not limited to the illustrated example. In various embodiments, the recess 501 may have two or more different widths due to the shape of the sensor area 531d or the asymmetrical shape of the first housing 510 and the second housing 520.

In an embodiment, at least a portion of the first housing 510 and the second housing 520 may be formed of a metal or non-metal material having a selected magnitude of stiffness to support the display 530. In an embodiment, at least a portion of the first housing 510 and the second housing 520 may include an electrically conductive material. In the case where the first housing 510 and the second housing 520 include an electrically conductive material, the electronic device 500 may transmit and receive radio waves using a portion of the first housing 510 and the second housing 520, which is formed of the electrically conductive material. For example, a processor or a communication module of the electronic device 500 may perform wireless communication using a portion of the first housing 510 and the second housing 520.

In an embodiment, the sensor area 531d may be formed to have a predetermined area adjacent to one corner of the first housing 510. However, the arrangement, shape, or size of the sensor area 531d is not limited to the illustrated example. For example, in an embodiment, the sensor area 531d may be provided at another corner of the first housing 510 or at any area between the top and bottom corners. In an embodiment, the sensor area 531d may be disposed in at least a portion of the second housing 520. In an embodiment, the sensor area 531d may be disposed to extend to the first housing 510 and the second housing 520. In an embodiment, the electronic device 500 may include components that are exposed to the front surface of the electronic device 500 through the sensor area 531d or through one or more openings provided in the sensor area 531d, and perform various functions through these components. The components disposed in the sensor area 531d may include, for example, at least one of a front camera device, a proximity sensor, an illuminance sensor, an iris recognition sensor, an ultrasonic sensor, and an indicator. However, the disclosure is not necessarily limited to this embodiment. The sensor area 531d may be omitted according to an embodiment, so that the components disposed in the sensor area 531d may be distributed and arranged in at least a portion of the first housing 510 and/or the second housing 520.

In an embodiment, the first rear cover 540 may be disposed on the second surface 512 of the first housing 510 and have a substantially rectangular periphery. In an embodiment, the periphery of the first rear cover 540 may be at least partially surrounded by the first housing 510. Similarly, the second rear cover 550 may be disposed on the fourth surface 522 of the second housing 520, and at least a portion of the periphery thereof may be surrounded by the second housing 520.

In the illustrated embodiment, the first rear cover 540 and the second rear cover 550 may have a substantially symmetrical shape with respect to the folding axis A. In an embodiment, the first rear cover 540 and the second rear cover 550 may include various shapes different from each other. In an embodiment, the first rear cover 540 may be integrally formed with the first housing 510, and the second rear cover 550 may be integrally formed with the second housing 520.

In an embodiment, the first rear cover 540, the second rear cover 550, the first housing 510, and the second housing 520 may be coupled to each other to provide a space in which various components (e.g., a printed circuit board, an antenna module, a sensor module, or a battery) of the electronic device 500 may be disposed. In an embodiment, one or more components may be disposed on the rear surface of the electronic device 500 or may be visually exposed therethrough. For example, one or more components or sensors may be visually exposed through the first rear area 541 of the first rear cover 540. In various embodiments, the sensor may include a proximity sensor, a rear camera device, and/or a flash. In an embodiment, at least a portion of a sub-display 552 may be visually exposed (e.g., visible) through the second rear area 551 of the second rear cover 550.

The display 530 may be disposed in a space formed by a pair of housings 510 and 520. For example, the display 530 may be seated on a recess (e.g., the recess 501 in FIG. 12) formed by the pair of housings 510 and 520, and may be arranged to occupy substantially most of the front surface of the electronic device 500. For example, the front surface of the electronic device 500 may include a display 530, and a partial area (e.g., an edge area) of the first housing 510 and a partial area (e.g., an edge area) of the second housing 520, which are adjacent to the display 530. In an embodiment, the rear surface of the electronic device 500 may include a first rear cover 540, a partial area (e.g., an edge area) of the first housing 510 adjacent to the first rear cover 540, a second rear cover 550, and a partial area (e.g., an edge area) of the second housing 520 adjacent to the second rear cover 550.

In an embodiment, the display 530 may indicate a display in which at least a partial area may be transformed into a flat or curved surface. In an embodiment, the display 530 may include a folding area 531c, a first display area 531a disposed on one side of the folding area 531c (e.g., in the right area of the folding area 531c), and a second display area 531b disposed on the opposite side thereof (e.g., in the left area of the folding area 531c). For example, the first display area 531a may be disposed on the first surface 511 of the first housing 510, and the second display area 531b may be disposed on the third surface 521 of the second housing 520. For example, the display 530 may extend from the first surface 511 to the third surface 521 by passing through the hinge module 564 in FIG. 14, and at least an area (e.g., the folding area 531c) corresponding to the hinge module 564 may be a flexible region that may be deformed from a flat shape to a curved shape.

In an embodiment, the areas of the display 530 are divided by way of example, and the display 530 may be divided into a plurality (e.g., four or more, or two) areas according to the structure or function. For example, in the embodiment shown in FIG. 12, the folding area 531c may extend in the direction of a longitudinal axis (e.g., the Y axis in FIG. 14) parallel to the folding axis A, and the areas of the display 530 may be divided by the folding area 531c or the folding axis (the axis A), but in an embodiment, the display 530 may be divided into areas, based on another folding area (e.g., a folding area parallel to the horizontal axis (e.g., the X-axis in FIG. 14)) or another folding axis (e.g., a folding axis parallel to the X-axis in FIG. 14). The above-described areas of the display indicate only physical division by the pair of housings 510 and 520 and the hinge module (e.g., the hinge module 564 in FIG. 14), and the display 530 may display substantially one entire screen.

According to an embodiment, the first display area 531a and the second display area 531b may have an overall symmetrical shape with respect to the folding area 531c. However, unlike the second display area 531b, the first display area 531a may include a notch area (e.g., the notch area 533 in FIG. 14) providing the sensor area 531d, and the remaining areas may have a symmetrical shape to the second display area 531b. For example, the first display area 531a and the second display area 531b may include portions having a shape symmetrical to each other and portions having a shape asymmetrical to each other.

Figure 14:
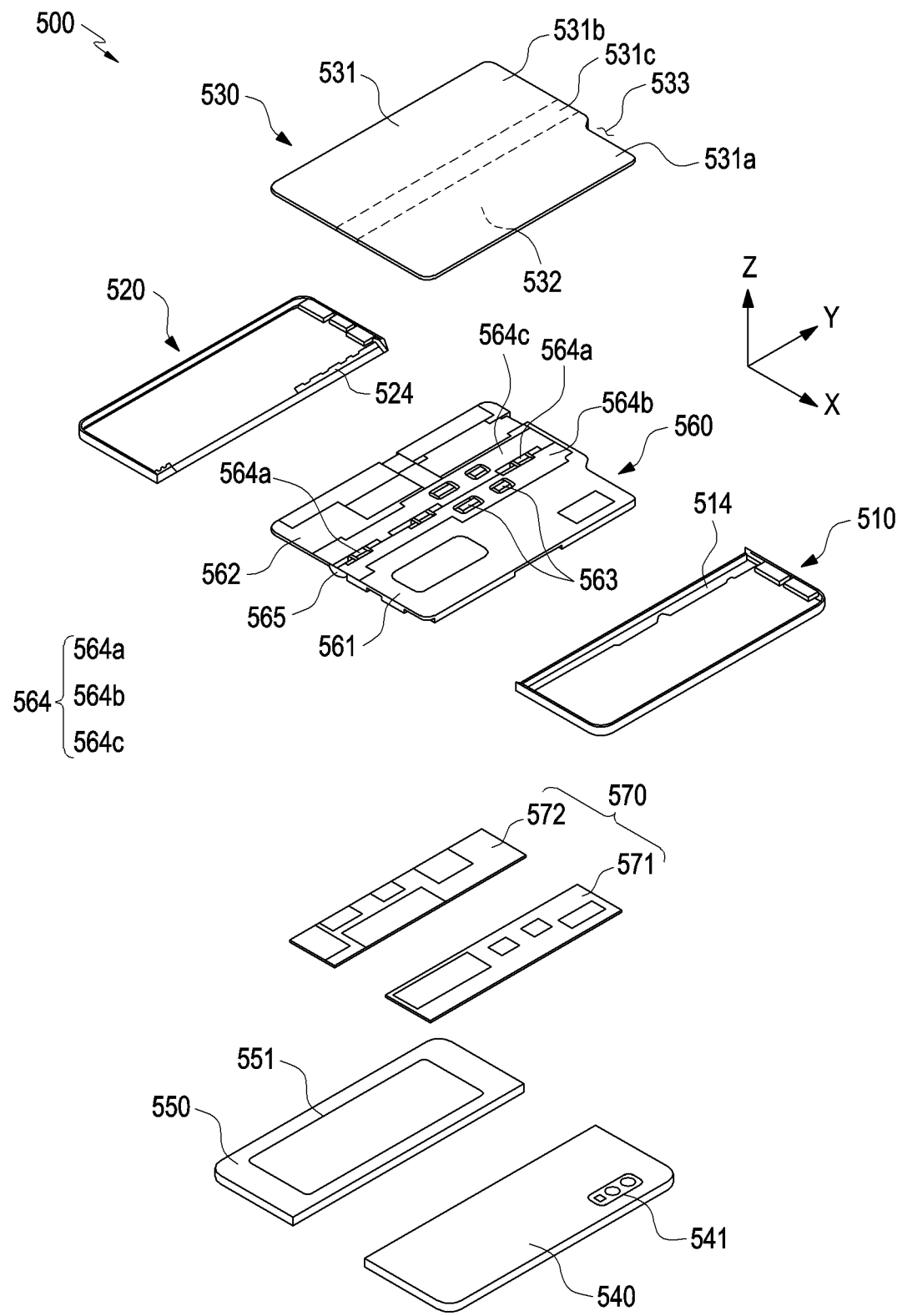
FIG. 14 is an exploded perspective view of a foldable electronic device according to various embodiments.

Referring further to FIG. 14, the hinge cover 565 may be disposed between the first housing 510 and the second housing 520 to cover internal components (e.g., the hinge module 564 in FIG. 14). In an embodiment, the hinge cover 565 may be covered by a part of the first housing 510 and the second housing 520 or may be exposed to the outside according to the operation state (an extended state or a folded state) of the electronic device 500.

Hereinafter, the operation of the first housing 510 and the second housing 520 according to the operation state (e.g., an extended state and a folded state) of the electronic device 500 and the respective areas of the display 530 will be described.

In an embodiment, when the electronic device 500 is in an extended state (e.g., the state in FIG. 12), the first housing 510 and the second housing 520 may form an angle of 180 degrees, and the first display area 531a and the second display area 531b of the display may be disposed to face in the same direction, for example, to display screens in a direction parallel to each other. In addition, the folding area 531c may form the same plane as the first display area 531a and the second display area 531b.

In an embodiment, when the electronic device 500 is in a folded state (e.g., the state in FIG. 13), the first housing 510 and the second housing 520 may be disposed to face each other. For example, when the electronic device 500 is in a folded state (e.g., the state in FIG. 13), the first display area 531a and the second display area 531b of the display 530 may form a small angle (e.g., between 0 and 10 degrees) therebetween so as to face each other. When the electronic device 500 is in a folded state (e.g., the state in FIG. 13), at least a portion of the folding area 531c may form a curved surface having a predetermined curvature.

In an embodiment, when the electronic device 500 is in an intermediate state, the first housing 510 and the second housing 520 may be disposed to form a certain angle, for example, 90 degrees or 120 degrees, therebetween. For example, in the intermediate state, the first display area 531a and the second display area 531b of the display 530 may form an angle greater than that in the folded state and smaller than that in the extended state. At least a portion of the folding area 531c may be configured as a curved surface having a predetermined curvature, and the curvature thereof may be smaller than that in the folded state.

FIG. 14 is an exploded perspective view of an foldable electronic device according to various embodiments.

Referring to FIG. 14, in an embodiment, the electronic device 500 may include a display 530, a support member assembly 560, at least one printed circuit board 570, a first housing 510, a second housing 520, a first rear cover 540, and a second rear cover 550. In this disclosure, the display 530 may be referred to as a display module or a display assembly. All or a part of the configurations of the support member assembly 560 in FIG. 14 may be the same as or similar to the configurations of the support member 300 in FIG. 4. For example, the support member assembly 560 may include a plurality of support members 300 connected using the hinge module 564.

The display 530 may include a display panel 531 (e.g., a flexible display panel) and one or more plates 532 or layers on which the display panel 531 is seated. In an embodiment, the plate 532 may be disposed between the display panel 531 and the support member assembly 560. The display panel 531 may be disposed in at least a portion of one surface (e.g., the surface in the Z direction in FIG. 14) of the plate 532. The plate 532 may be formed in a shape corresponding to the display panel 531. For example, a partial area of the plate 532 may be formed in a shape corresponding to the notch area 533 of the display panel 531.

The support member assembly 560 may include a first support member 561, a second support member 562, a hinge module 564 disposed between the first support member 561 and the second support member 562, a hinge cover 565 that covers the hinge module 564 when viewed from the outside, and a wire member 563 (e.g., a flexible printed circuit board (FPCB)) crossing the first support member 561 and the second support member 562.

In an embodiment, the support member assembly 560 may be disposed between the plate 532 and at least one printed circuit board 570. For example, the first support member 561 may be disposed between the first display area 531a of the display 530 and a first printed circuit board 571. The second support member 562 may be disposed between the second display area 531b of the display 530 and a second printed circuit board 572.

In an embodiment, at least a part of the wire member 563 and the hinge module 564 may be disposed inside the support member assembly 560. The wire member 563 may be disposed in a direction (e.g., the X-axis direction) crossing the first support member 561 and the second support member 562. The wire member 563 may be disposed in a direction (e.g., the X-axis direction) perpendicular to a folding axis (e.g., the Y-axis or the folding axis A in FIG. 12) of the folding area 531c.

According to various embodiments, the hinge module 564 may include a hinge module 564a, a first hinge plate 564b, and/or a second hinge plate 564c. In various embodiments, the hinge module 564a may be interpreted as including the first hinge plate 564b and the second hinge plate 564c. In an embodiment, the first hinge plate 564b may be mounted inside the first housing 510, and the second hinge plate 564c may be mounted inside the second housing 520. In various embodiments, the first hinge plate 564b may be coupled to the first support member 561, and the second hinge plate 564c may be coupled to the second support member 562. In an embodiment, the first hinge plate 564b (or the second hinge plate 564c) may be coupled to another structure (e.g., a first rotation support surface 514 or a second rotation support surface 524) inside the first housing 510 (or the second housing 520). For example, the structure to which the first hinge plate 564b (or the second hinge plate 564c) is coupled inside the first housing 510 (or the second housing 520) may vary according to embodiments. In an embodiment, the hinge module 564a may be coupled to the first hinge plate 564b and the second hinge plate 564c to rotatably connect the second hinge plate 564c to the first hinge plate 564b. For example, a folding axis (e.g., the folding axis A in FIG. 12) may be formed by the hinge module 564a, and the first housing 510 and the second housing 520 (or the first support structure 561 and the second support structure 562) may rotate substantially relative to each other about the folding axis A.

As described above, at least one printed circuit board 570 may include a first printed circuit board 571 disposed on the first support member 561 and a second printed circuit board 572 disposed on the second support member 562. The first printed circuit board 571 and the second printed circuit board 572 may be disposed inside the space formed by the support member assembly 560, the first housing 510, the second housing 520, the first rear cover 540, and the second the rear cover 550. Components for implementing various functions of the electronic device 500 may be mounted on the first printed circuit board 571 and the second printed circuit board 572.

In an embodiment, the first housing 510 and the second housing 520 may be assembled with each other so as to be coupled to both sides of the support member assembly 560 in the state in which the display 530 is coupled to the support member assembly 560. The first housing 510 and the second housing 520 may be coupled to both sides of the support member assembly 560, for example, to the first support member 561 and the second support member 562, respectively, so as to slide. The first support member 561 and the second support member 562 may be substantially accommodated inside the first housing 510 and the second housing 520, and, according to an embodiment, may be interpreted as parts of the first housing 510 and the second housing 520.

In an embodiment, the first housing 510 may include a first rotation support surface 514, and the second housing 520 may include a second rotation support surface 524 corresponding to the first rotation support surface 514. The first rotation support surface 514 and the second rotation support surface 524 may include a curved surface corresponding to the curved surface included in the hinge cover 565.

In an embodiment, when the electronic device 500 is in an extended state (e.g., the state in FIG. 12), the first rotation support surface 514 and the second rotation support surface 524 may cover the hinge cover 565 such that the hinge cover 565 is not exposed to the rear surface of the electronic device 500 or is minimally exposed thereto. In an embodiment, when the electronic device 500 is in a folded state (e.g., the state in FIG. 13), the first rotation support surface 514 and the second rotation support surface 524 may rotate along the curved surface included in the hinge cover 565 such that the hinge cover 565 is maximally exposed to the rear surface of the electronic device 500.

In the above detailed description, the first housing 510, the second housing 520, the first side member 513, or the second side member 523, etc., are examples of using ordinal numbers to distinguish the elements, and it should be noted that the ordinal numbers are not intended to limit the disclosure. For example, although it has been illustrated that the sensor area 531d is formed in the first housing 510, the sensor area 531d may be formed in the second housing 520 or may be formed both in the first housing 510 and in the second housing 520. In an embodiment, although it has been illustrated that the first rear area 541 is disposed on the first rear cover 540 and that the sub-display 552 is disposed on the second rear cover 550, both the first rear area 541 for arranging sensors, etc. and the sub-display 552 for outputting a screen may be disposed on one of either the first rear cover 540 or the second rear cover 550.

According to an embodiment, the hinge module 564 may include a plurality of hinge modules arranged in parallel. For example, the hinge module 564 may include a first hinge module (not shown) and a second hinge module (not shown), which are symmetrical with respect to a width direction (e.g., the X-axis direction) of the electronic device 500.

Figure 15:
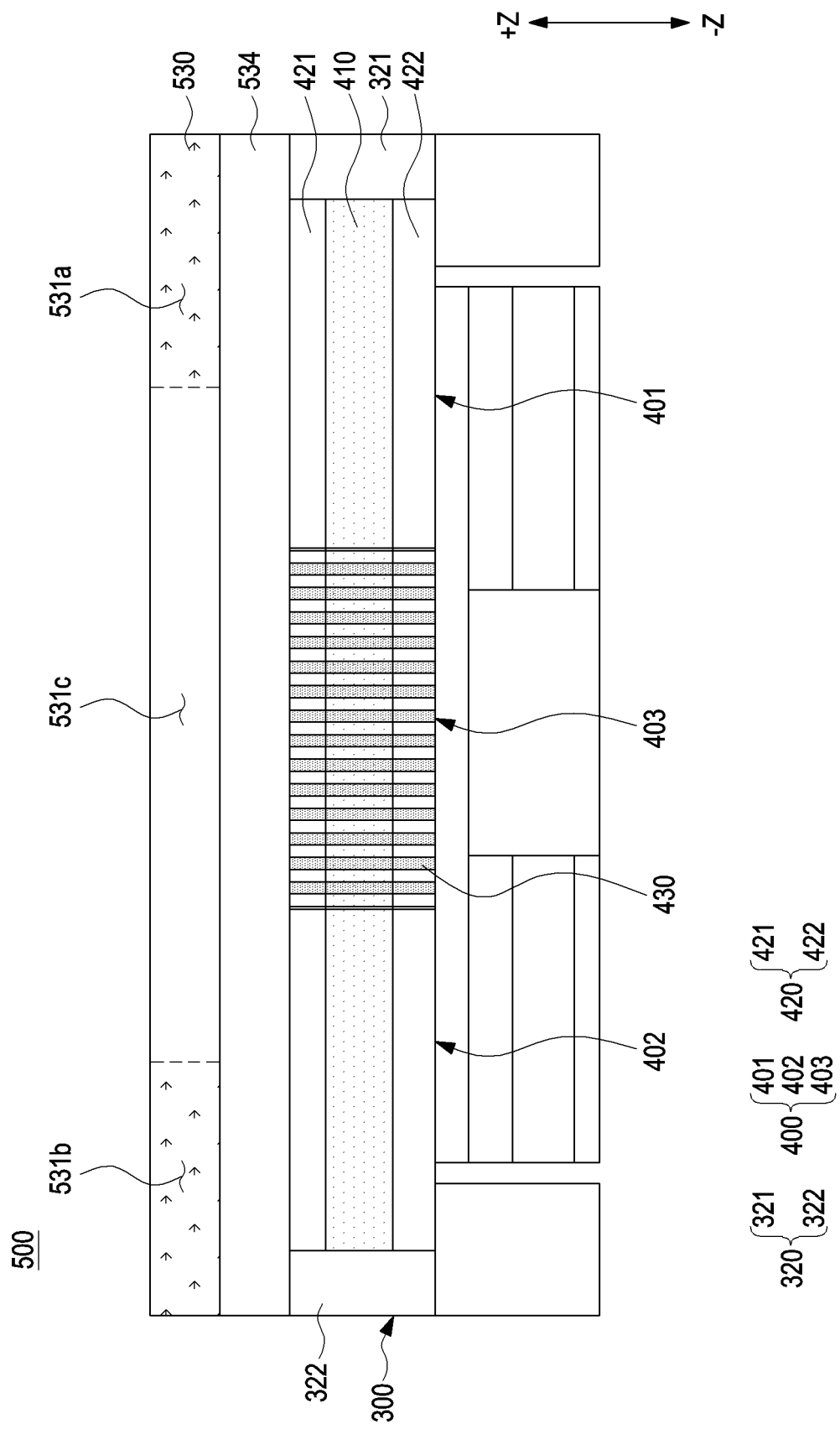
FIG. 15 is a cross-sectional view of a foldable electronic device according to an embodiment of the disclosure.
Figure 16:
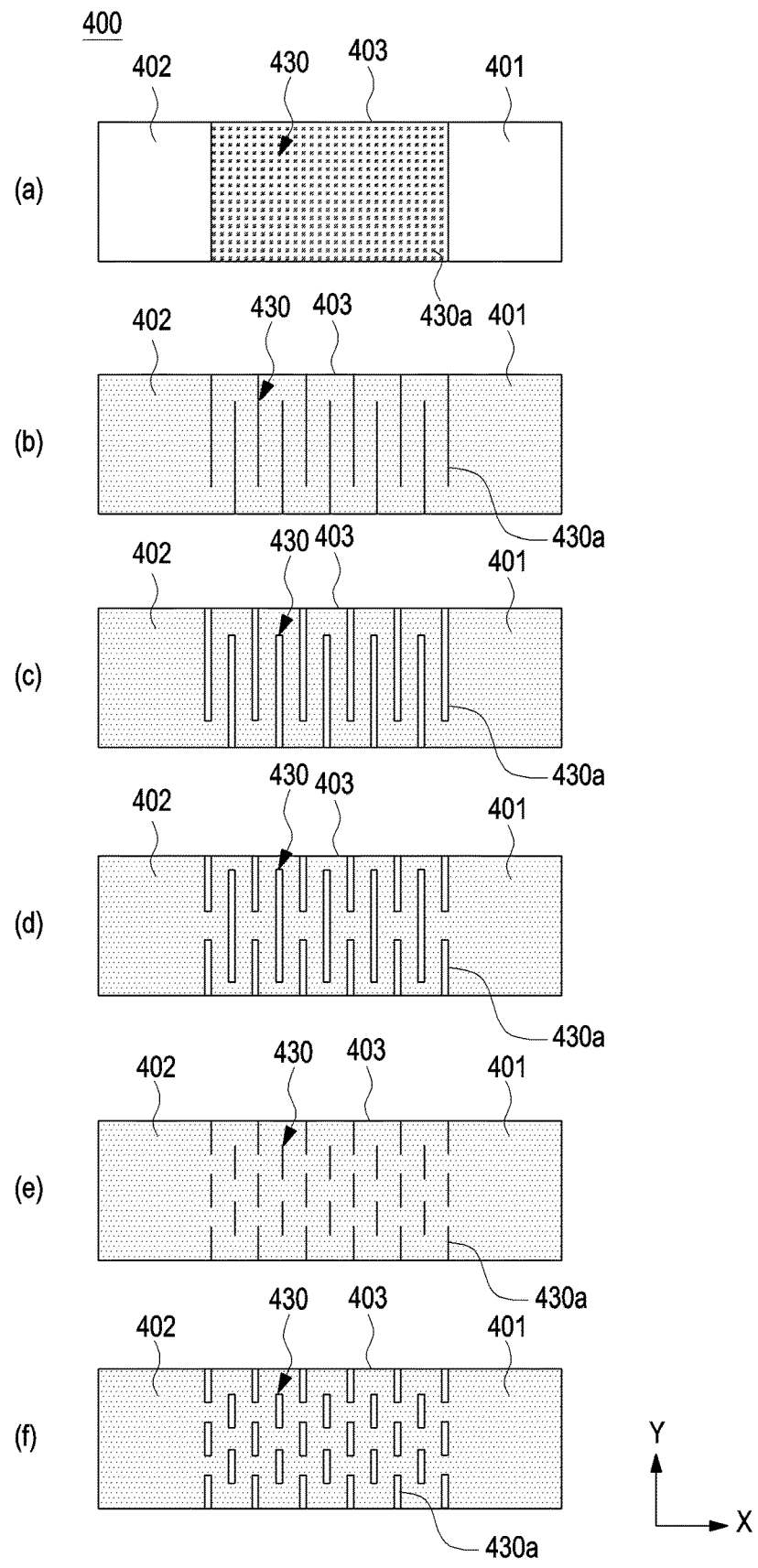
FIG. 16 is a diagram of a heat dissipation structure according to various embodiments.
Figure 17:
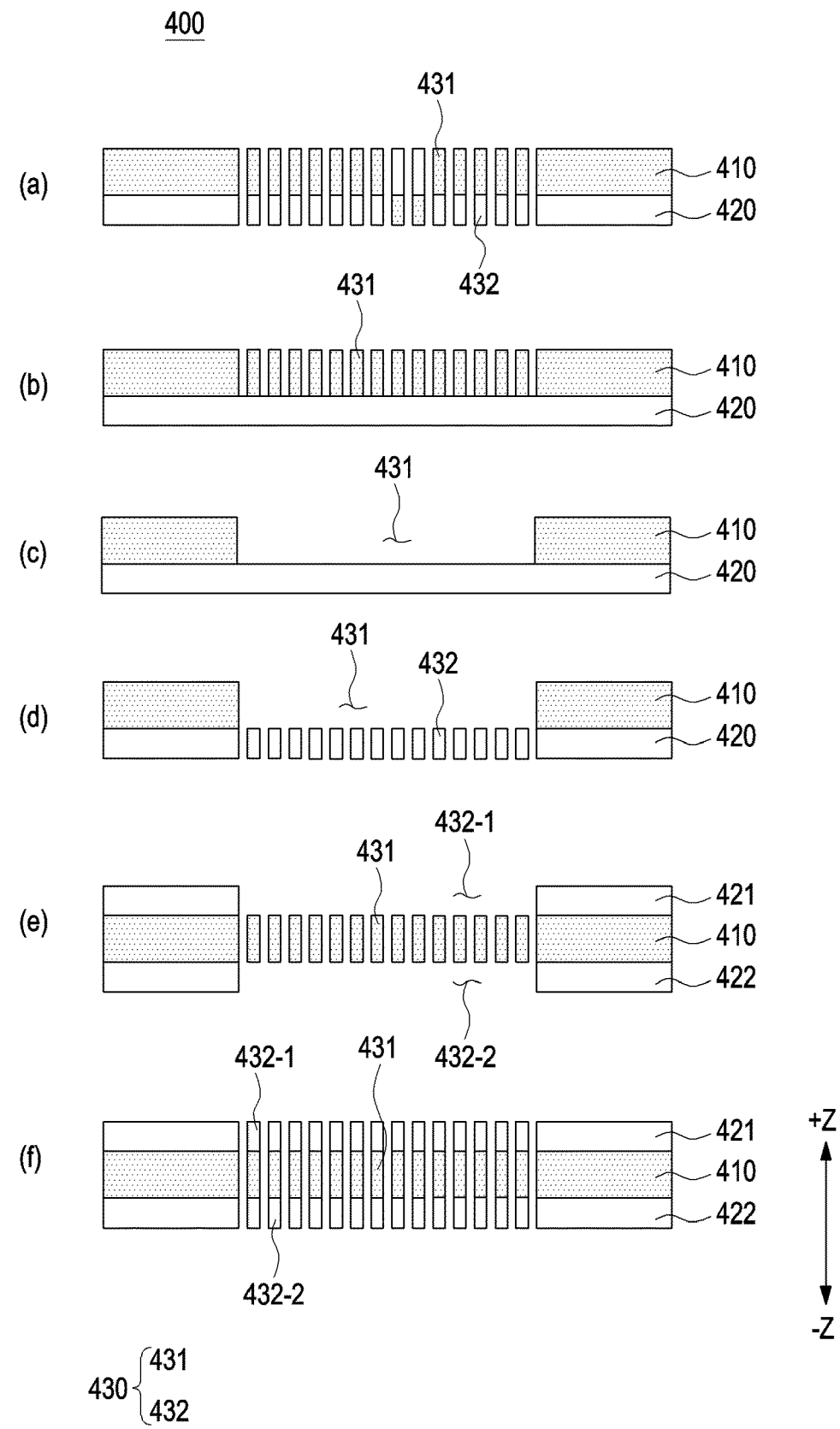
FIG. 17 is a cross-sectional view of a heat dissipation structure according to various embodiments.

FIG. 15 is a cross-sectional view of an electronic device according to various embodiments. FIG. 16 is a diagram illustrating a heat dissipation structure according to various embodiments. FIG. 17 is a cross-sectional view of a heat dissipation structure according to various embodiments.

Referring to FIGS. 15, 16, and 17, the electronic device 500 may include a support member 300, a heat dissipation structure 400, and a display 530. All or a part of the configurations of the support member 300 and the heat dissipation structure 400 in FIG. 15 may be the same as or similar to the configurations of the support member 300 and the heat dissipation structure 400 in FIGS. 5A to 5B, and all or a part of the configurations of the electronic device 500 and the display 530 may be the same as or similar to the configurations of the electronic device 500 and the display 530 in FIG. 12.

According to various embodiments, the electronic device 500 may include an adhesive member 534 for bonding the display 530 to the support member 300. According to an embodiment, the adhesive member 534 may be disposed between the display 530 and the support member 300. According to an embodiment, the adhesive member 534 may be a pressure-sensitive adhesive (PSA).

According to various embodiments, the support member 300 may include a through-hole 310. At least a portion of the through-hole 310 may face the folding area 531c of the display 530.

According to various embodiments, the support member 300 may include a first side wall structure 321 and a second side wall structure 322. According to an embodiment, the first side wall structure 321 may be positioned in a first housing (e.g., first housing 510 in FIG. 12), and the second side wall structure 322 may be positioned in a second housing (e.g., the second housing 510 in FIG. 12). According to an embodiment, the first side wall structure 321 may face the second side wall structure 322 in an extended state (e.g., FIG. 12) of the electronic device 500.

According to various embodiments, at least a portion of the heat dissipation structure 400 may be folded based on the movement of the electronic device 500. According to an embodiment, the heat dissipation structure 400 may include a first area 401 bonded to the first side wall structure 321 and a second area 402 bonded to the second side wall structure 322. According to an embodiment, the first area 401 may rotate relative to the second area 402, based on the folding operation of the electronic device 500. According to an embodiment, the heat dissipation structure 400 may include a third area 403 positioned between the first area 401 and the second area 402. According to an embodiment, at least a portion of the first area 401 may face the first display area 531a. At least a portion of the second area 402 may face the second display area 531b. At least a portion of the third area 403 may face the folding area 531c and/or the folding axis (e.g., the folding axis A in FIG. 12).

According to various embodiments, the third area 403 may include a pattern structure 430 including at least one recess 430a. The recess 430a may be a through-hole or a groove formed in the heat dissipation layer 410 and/or the protective layer 420. According to an embodiment, the pattern structure 430 may be interpreted as a torsion link. For example, at least a portion of the heat dissipation structure 400 may be folded based on the third area 403. According to an embodiment, the stiffness of the third area 403 including the pattern structure 430 may be lower than that of the first area 401 and/or the second area 402 that does not include the pattern structure 430.

According to various embodiments, the first area 401 may be thermally connected to the second area 402 through the third area 403. For example, at least a portion of the heat dissipation structure 400 may be formed to extend from the first area 401 to the second area 402 by passing through the third area 403. At least some of the heat transferred to the first area 401 may be dispersed to the second area 402 by passing through the third area 403.

According to various embodiments, the pattern structure 430 may be formed in various shapes. According to an embodiment (e.g., (a) in FIG. 16), the pattern structure 430 may include recesses 430a that are formed to be perforated, excluding a plurality of protrusions that are spaced apart. According to various embodiments (e.g., (b), (c), (d), (e), and (f) in FIG. 16), the recesses 430a may be configured in the form of a plurality of holes and/or slits extending in the width direction (e.g., the X-axis direction). The width of the recess 430a and the number of recesses 430a arranged may be variously configured.

According to various embodiments, the pattern structure 430 may be formed on at least one of the heat dissipation layer 410 and the protective layer 420. According to an embodiment, the pattern structure 430 may be formed on the heat dissipation layer 410, and may be selectively formed on the protective layer 420.

According to various embodiments (e.g., (a), (d), (e), and (f) in FIG. 17), the pattern structure 430 may be formed on the heat dissipation layer 410 and the protective layer 420. For example, the pattern structure 430 may include a first pattern structure 431 positioned on the heat dissipation layer 410 and a second pattern structure 432 formed on the protective layer 420.

According to various embodiments (e.g., (b) and (c) in FIG. 17), the pattern structure 430 may be formed on the heat dissipation layer 410, and the protective layer 420 may not include the pattern structure 430. For example, the protective layer 420 may be formed to extend from the first area 401 to the second area 402 of the heat dissipation structure 400. For example, the pattern structure 430 may include a first pattern structure 431 positioned on the heat dissipation layer 410.

According to an embodiment (e.g., (a), (b), (d), (e), and (f) in FIG. 17), the pattern structure 430 may include at least one recess (e.g., the recess 430a in FIG. 16). According to an embodiment (e.g., (c) and (d) in FIG. 17), the pattern structure 430 may be interpreted as an empty space. For example, the heat dissipation layer 410 may be positioned in the first area 401 and the second area 402 of the heat dissipation structure 400, but may not be positioned in the third area 403.

According to various embodiments (e.g., (e) and (f) in FIG. 17), the protective layer 420 include a first protective layer 421 disposed on the heat dissipation layer 410 and a second protective layer 422 disposed on the heat dissipation layer 420. According to an embodiment, the pattern structure 430 may be formed on the first protective layer 421 and/or the second protective layer 422. For example, the pattern structure 430 may include a first pattern structure 431 formed on the heat dissipation layer 410, a 2-1st pattern structure 432-1 formed on the first protective layer 421, and/or a 2-2nd pattern structure 432-2 formed on the second protective layer 422.

According to various example embodiments, an electronic device (e.g., the electronic device 200 in FIG. 2) may include: a housing (e.g., the housing 210 in FIG. 2), a display (e.g., the display 220 in FIG. 2) accommodated inside the housing, a support (e.g., the support member 300 in FIG. 5A) supporting the display and including a opening, (e.g., the through-hole 310 in FIG. 5C) a side wall (e.g., the side wall structure 320 in FIG. 5A) surrounding the opening, and a heat dissipation structure (e.g., the heat dissipation structure 400 in FIG. 5A) at least a portion of which is positioned in the opening and bonded to the side wall structure, wherein the heat dissipation structure may include a heat dissipation layer (e.g., the heat dissipation layer 410 in FIG. 7A) having a first thermal conductivity and a protective layer (e.g., the protective layer 420 in FIG. 7A) having a second thermal conductivity, is the second conductivity being lower than the first thermal conductivity, the protective layer covering at least a portion of the heat dissipation layer.

According to various example embodiments, the protective layer may include a first protective layer (e.g., the first protective layer 421 in FIG. 7B) disposed on one side of the heat dissipation layer and a second protective layer (e.g., the second protective layer 422 in FIG. 7B) disposed another side of the heat dissipation layer.

According to various example embodiments, the heat dissipation structure may be a clad in which the heat dissipation layer and the protective layer are bonded.

According to various example embodiments, the support may comprise at least one of stainless steel, aluminum, titanium, or magnesium, and the side wall may include a groove (e.g., the groove 323 in FIG. 8B) accommodating at least a portion of the protective layer.

According to various example embodiments, the heat dissipation layer may include at least one of copper, aluminum, or magnesium.

According to various example embodiments, the protective layer may include at least one of stainless steel, magnesium, titanium, or aluminum.

According to various example embodiments, a first thickness (e.g., the first thickness t1 in FIG. 7A) of the heat dissipation layer may be in a range of ⅓ to ⅔ of a second thickness (e.g., the second thickness t2 in FIG. 7A) of the heat dissipation structure.

According to various example embodiments, a second modulus of elasticity of the protective layer may be greater than a first modulus of elasticity of the heat dissipation layer.

According to various example embodiments, a second yield strength of the protective layer is greater than a first yield strength of the heat dissipation layer.

According to various example embodiments, the housing may include a first housing (e.g., the first housing 510 in FIG. 12) and a second housing (e.g., the second housing 520 in FIG. 12) configured to rotate relative to the first housing, and the electronic device may further include a hinge module (e.g., the hinge module 564 in FIG. 14) comprising a hinge connected to the first housing and the second housing, and the display may include a first display area (e.g., the first display area 531a in FIG. 13) accommodated inside the first housing, a second display area (e.g., the second display area 531b in FIG. 13) accommodated inside the second housing, and a folding area (e.g., the folding area 531c in FIG. 13) positioned between the first display area and the second display area.

According to various example embodiments, at least a portion of the opening may face the folding area, and the support may include a first side wall (e.g., the first side wall structure 311 in FIG. 15) positioned inside the first housing and a second side wall (e.g., the second side wall structure 321 in FIG. 15) positioned inside the second housing, and the heat dissipation structure may include a first area (e.g., the first area 401 in FIG. 15) connected to the first side wall, a second area (e.g., the second area 402 in FIG. 15) connected to the second side wall, and a third area (e.g., the third area 403 in FIG. 15) positioned between the first area and the second area, and the third area may include a pattern structure (e.g., the pattern structure 430 in FIG. 15) including at least one recess (e.g., the recess 430a in FIG. 16).

According to various example embodiments, the support may include a resin, and the side wall may include a groove (e.g., the groove 323 in FIG. 15) accommodating at least a portion of the protective layer.

According to various example embodiments, the support may include an overlapping area (e.g., the overlapping area 330 in FIG. 11) facing the heat dissipation structure and including a protruding or recessed uneven structure (e.g., the uneven structure 331 in FIG. 11).

According to various example embodiments, a thickness of the heat dissipation structure may be in a range of 0.01 mm to 1 mm.

According to various example embodiments, the electronic device may further include a battery (e.g., the battery 250 in FIG. 6) disposed inside the housing, and at least a portion of the heat dissipation structure may face at least a portion of the battery.

According to various example embodiments of the disclosure, an electronic device (e.g., the electronic device 200 in FIG. 12) may include: a housing (e.g., the housings 510 and 520 in FIG. 12) including a first housing (e.g., the first housing 510 in FIG. 12) and a second housing (e.g., the second housing 520 in FIG. 12), a hinge module comprising a hinge (e.g., the hinge module 564 in FIG. 14) accommodated in the housing and connected to the first housing and the second housing, a display (e.g., the display 530 in FIG. 12) disposed over the first housing, the hinge module, and the second housing, a support (e.g., the support member 300 in FIG. 15) including a first side wall (e.g., the first side wall structure 321 in FIG. 15) positioned inside the first housing and a second side wall (e.g., the second side wall structure 322 in FIG. 15) positioned inside the second housing; and a heat dissipation structure (e.g., the heat dissipation structure 400 in FIG. 15) including a first area (e.g., the first area 401 in FIG. 15) bonded to the first side wall, a second area (e.g., the second area 402 in FIG. 15) bonded to the second side wall, and a third area (e.g., the third area 403 in FIG. 15) positioned between the first area and the second area, and configured to be folded based on the third area, wherein the heat dissipation structure may include a heat dissipation layer (e.g., the heat dissipation layer 410 in FIG. 15) having a first thermal conductivity and a protective layer (e.g., the protective layer 420 in FIG. 15) having a second thermal conductivity, wherein the second thermal conductivity is lower than the first thermal conductivity, the protective layer is covering at least a portion of the heat dissipation layer.

While the disclosure has been illustrated and described with reference to various example embodiments, it will be understood that the various example embodiments are intended to be illustrative, not limiting. It will be further understood by those of ordinary skill in the art that various substitutions, modifications, and changes may be made without departing from the technical scope of the disclosure, including the appended claims and their equivalents. It will also be understood that any of the embodiment(s) described herein may be used in conjunction with any other embodiment(s) described herein.

What is claimed is:

1. An electronic device comprising:
a housing including a first housing and a second housing;
a hinge module comprising a hinge accommodated in the housing and connected to the first housing and the second housing;
a display accommodated inside the housing, and including a first display area accommodated in the first housing, a second display area accommodated in the second housing and a folding area positioned between the first display area and the second display area;
a support disposed in the housing, including an opening between a front surface and a rear surface of the support, and including a side wall surrounding the opening; and
a heat dissipation structure at least a portion of which is positioned in the opening which is a portion of the support and bonded to the side wall,
wherein the heat dissipation structure comprises a heat dissipation layer having a first thermal conductivity and a protective layer having a second thermal conductivity,
wherein the second thermal conductivity is lower than the first thermal conductivity,
wherein the protective layer is covering at least a portion of the heat dissipation layer, and
wherein at least a portion of the opening faces the folding area, and a third area of the heat dissipation structure, which is positioned to correspond to the folding area, comprises a pattern comprising at least one recess.

2. The electronic device according to claim 1, wherein the protective layer comprises a first protective layer disposed on a first side of the heat dissipation layer and a second protective layer disposed on a second side the heat dissipation layer opposite the first side.

3. The electronic device according to claim 1, wherein the heat dissipation structure comprises a clad in which the heat dissipation layer and the protective layer are bonded.

4. The electronic device according to claim 1, wherein the support comprises at least one of stainless steel, aluminum, titanium, or magnesium, and wherein the side wall comprises a groove accommodating at least a portion of the protective layer.

5. The electronic device according to claim 1, wherein the heat dissipation layer comprises at least one of copper, aluminum, or magnesium.

6. The electronic device according to claim 1, wherein the protective layer comprises at least one of stainless steel, magnesium, titanium, or aluminum.

7. The electronic device according to claim 1, wherein a first thickness of the heat dissipation layer is in a range of ⅓ to ⅔ of a second thickness of the heat dissipation structure.

8. The electronic device according to claim 1, wherein a second modulus of elasticity of the protective layer is greater than a first modulus of elasticity of the heat dissipation layer.

9. The electronic device according to claim 1, wherein a second yield strength of the protective layer is greater than a first yield strength of the heat dissipation layer.

10. The electronic device according to claim 1, wherein the support further comprises a resin, and
wherein the side wall comprises a groove accommodating at least a portion of the protective layer.

11. The electronic device according to claim 10, wherein the support comprises an overlapping area facing the heat dissipation structure and comprises an uneven structure.

12. The electronic device according to claim 1, wherein a thickness of the heat dissipation structure is in a range of 0.01 mm to 1 mm.

13. The electronic device according to claim 1, further comprising a battery disposed inside the housing,
wherein at least a portion of the heat dissipation structure faces at least a portion of the battery.

14. An electronic device comprising:
a housing comprising a first housing and a second housing;
a hinge module comprising a hinge accommodated in the housing and connected to the first housing and the second housing;
a display disposed over the first housing, the hinge module, and the second housing;
a support comprising a first side wall positioned inside the first housing and a second side wall positioned inside the second housing; and
a heat dissipation structure comprising a first area bonded to the first side wall, a second area bonded to the second side wall, and a third area positioned between the first area and the second area, and configured to be folded based on the third area,
wherein the heat dissipation structure comprises a heat dissipation layer having a first thermal conductivity and a protective layer having a second thermal conductivity, and
wherein the second thermal conductivity is lower than the first thermal conductivity, the protective layer is covering at least a portion of the heat dissipation layer.

15. The electronic device according to claim 14, wherein the protective layer comprises a first protective layer disposed on a first side of the heat dissipation layer and a second protective layer disposed on a second side of the heat dissipation layer opposite the first side.

16. The electronic device according to claim 14, wherein the heat dissipation structure comprises a clad in which the heat dissipation layer and the protective layer are bonded.

17. The electronic device according to claim 14, wherein the third area comprises a pattern comprising at least one recess.

18. The electronic device according to claim 14, wherein the heat dissipation layer comprises at least one of copper, aluminum, or magnesium, and
wherein the protective layer comprises at least one of stainless steel, magnesium, titanium, or aluminum.

* * * * *